United States Patent
Oda et al.

(10) Patent No.: US 11,474,429 B2
(45) Date of Patent: Oct. 18, 2022

(54) METHOD OF PRODUCING SUBSTRATE WITH FINE UNEVEN PATTERN, RESIN COMPOSITION, AND LAMINATE

(71) Applicant: MITSUI CHEMICALS, INC., Tokyo (JP)

(72) Inventors: Takashi Oda, Ichihara (JP); Hisanori Ohkita, Chiba (JP); Yasuhisa Kayaba, Urayasu (JP)

(73) Assignee: MITSUI CHEMICALS, INC., Tokyo (JP)

( * ) Notice: Subject to any disclaimer, the term of this patent is extended or adjusted under 35 U.S.C. 154(b) by 374 days.

(21) Appl. No.: 16/619,696

(22) PCT Filed: Jun. 5, 2018

(86) PCT No.: PCT/JP2018/021487
§ 371 (c)(1),
(2) Date: Dec. 5, 2019

(87) PCT Pub. No.: WO2018/225707
PCT Pub. Date: Dec. 13, 2018

(65) Prior Publication Data
US 2020/0166835 A1    May 28, 2020

(30) Foreign Application Priority Data
Jun. 9, 2017    (JP) .............................. JP2017-114363

(51) Int. Cl.
*G03F 7/00* (2006.01)
*B29C 59/02* (2006.01)
(Continued)

(52) U.S. Cl.
CPC ............ *G03F 7/0002* (2013.01); *B29C 59/02* (2013.01); *C08G 61/08* (2013.01);
(Continued)

(58) Field of Classification Search
CPC ..... B29C 33/38; B29C 59/02; C08G 2261/11; C08G 2261/146; C08G 2261/3324;
(Continued)

(56) References Cited

U.S. PATENT DOCUMENTS 8,597,769 B2    12/2013    Takaya et al.
9,056,938 B2    6/2015    Sunaga et al.
(Continued)

FOREIGN PATENT DOCUMENTS

JP    2009119694 A    6/2009
JP    2010284970 A    12/2010
(Continued)

OTHER PUBLICATIONS

International Search Report (PCT/ISA/210) dated Aug. 14, 2018, by the Japan Patent Office as the International Searching Authority for International Application No. PCT/JP2018/021487.
(Continued)

*Primary Examiner* — Lan Vinh
(74) *Attorney, Agent, or Firm* — Buchanan Ingersoll & Rooney PC

(57) ABSTRACT

A method of producing a substrate with a fine uneven pattern is a method of producing a substrate having a fine uneven pattern on a surface thereof, the method including a step (a) of preparing a laminate provided with a substrate and a first resin layer provided on the substrate and having a first fine uneven pattern formed on a surface thereof; and a step (b) of forming a second fine uneven pattern corresponding to the first fine uneven pattern on the surface of the substrate by etching the surface of the first fine uneven pattern using the first resin layer as a mask, in which the first resin layer is formed of a resin composition (P) including a fluorine-containing cyclic olefin polymer (A) or a cured product of the resin composition (P).

15 Claims, 3 Drawing Sheets

(51) Int. Cl.
  *C08G 61/08* (2006.01)
  *H01L 21/027* (2006.01)
(52) U.S. Cl.
  CPC ...... *H01L 21/0271* (2013.01); *C08G 2261/11* (2013.01); *C08G 2261/3325* (2013.01)
(58) Field of Classification Search
  CPC ............ C08G 2261/3325; C08G 61/08; G03F 7/0002; H01L 21/0271; H01L 21/3065
  USPC ......... 430/310, 312, 313; 216/44, 47, 48, 49
  See application file for complete search history.

(56) References Cited

U.S. PATENT DOCUMENTS

| | | | |
|---|---|---|---|
| 9,314,963 | B2 | 4/2016 | Sunaga et al. |
| 10,000,633 | B2 | 6/2018 | Sunaga et al. |
| 2010/0310830 | A1 | 12/2010 | Takaya et al. |
| 2011/0301313 | A1 | 12/2011 | Sunaga et al. |
| 2012/0156448 | A1 | 6/2012 | Sunaga et al. |
| 2014/0021648 | A1 | 1/2014 | Sunaga et al. |
| 2015/0274954 | A1* | 10/2015 | Sunaga ................. C08F 283/14 264/447 |
| 2015/0368433 | A1 | 12/2015 | Kitagawa et al. |
| 2016/0246170 | A1* | 8/2016 | Bowen ................... B32B 3/266 |
| 2016/0308020 | A1* | 10/2016 | Sreenivasan ...... H01L 21/31144 |
| 2016/0363858 | A1 | 12/2016 | Shimatani |
| 2017/0351172 | A1* | 12/2017 | Yonezawa ............. G03F 7/0002 |

FOREIGN PATENT DOCUMENTS

| | | |
|---|---|---|
| JP | 2012-149151 A | 8/2012 |
| JP | 2012149151 A | 8/2012 |
| JP | 2014196284 A | 10/2014 |
| JP | 2015071741 A | 4/2015 |
| JP | 2017005207 A | 1/2017 |
| WO | 2010098102 A1 | 9/2010 |
| WO | 2011024421 A1 | 3/2011 |

OTHER PUBLICATIONS

Written Opinion (PCT/ISA/237) dated Aug. 14, 2018, by the Japan Patent Office as the International Searching Authority for International Application No. PCT/JP2018/021487.

* cited by examiner (a1)

US 11,474,429 B2

METHOD OF PRODUCING SUBSTRATE WITH FINE UNEVEN PATTERN, RESIN COMPOSITION, AND LAMINATE

TECHNICAL FIELD

The present invention relates to a method of producing a substrate with a fine uneven pattern, a resin composition and a laminate.

BACKGROUND ART

A photolithography method and a nanoimprint lithography method are known as methods of forming a fine uneven pattern on the surface of a substrate. While the photolithography method involves an expensive apparatus and a complicated process, the nanoimprint lithography method has an advantage that it is possible to produce a fine uneven pattern on a surface of a substrate with a simple apparatus and process. In addition, the nanoimprint lithography method is a preferable method for forming various shapes such as comparatively wide and deep uneven structures, dome shapes, quadrangular pyramids, and triangular pyramids.

In a method for forming a fine uneven pattern on a substrate using a nanoimprint lithography method, for example, a fine uneven pattern is transferred onto a resin layer (also referred to as a resist layer) formed on a substrate using a mold having a fine uneven pattern in the order of nanometers on the surface, then the substrate is etched using the obtained resin layer having a fine uneven pattern as a mask, and the fine uneven pattern is imparted onto the substrate.

Examples of techniques related to a method for forming a fine uneven pattern on a substrate using such a nanoimprint lithography method include the techniques described in Patent Document 1 (Japanese Unexamined Patent Application Publication No. 2010-284970) and Patent Document 2 (Japanese Unexamined Patent Application Publication No. 2015-71741).

Patent Document 1 describes a nano-imprinting method including a step of coating a nanoimprint resist, which includes a hyperbranched polyurethane oligomer, perfluoropolyether, a methyl methacrylate resin, and an organic diluent, on one surface of a substrate to form a resist layer; a step of providing a mold having a nano-level pattern on one surface and transferring the nano-level pattern to the resist layer, and a step of processing the substrate corresponding to the nano-level pattern and forming the nano-level pattern on the one surface of the substrate.

Patent Document 2 describes a pattern forming method including a step of coating a curable composition including a polyfunctional unsaturated compound (A) having two or more ethylenic unsaturated groups as a curing component, a polyfunctional thiol compound (B) having two or more thiol groups, and a polymer (C) with a weight average molecular weight of 12,000 or less and having substantially no fluorine atom, onto a substrate to form a transfer layer; a step of pressing a mold on the transfer layer, a step of pressing the mold and then irradiating the transfer layer with light, and a step of separating the mold from the transfer layer after the light irradiation and then etching the substrate using the transfer layer as a mask.

RELATED DOCUMENT

Patent Document

[Patent Document 1] Japanese Unexamined Patent Application Publication No. 2010-284970

[Patent Document 2] Japanese Unexamined Patent Application Publication No. 2015-71741

SUMMARY OF THE INVENTION

Technical Problem

According to the investigation of the present inventors, it was found that, in relation to a method for forming a fine uneven pattern on a substrate using a nanoimprint lithography method, a resin layer capable of transferring the fine uneven pattern onto a mold surface may be inferior in terms of the etching property. In such a case, it may not be possible to etch the substrate positioned below the resin layer into a desired shape. That is, it may not be possible to form the fine uneven pattern on the surface of the substrate with high precision. In particular, it was found that this tendency tends to be remarkable in a case where the resin layer is comparatively thick.

On the other hand, there is a demand for substrates having an uneven shape with higher precision and with more freedom in the width and depth.

The present invention was made in view of the above circumstances and provides a method of producing a substrate with a fine uneven pattern capable of obtaining a substrate with a fine uneven pattern with excellent dimensional precision and a resin composition used for this producing method.

Solution to Problem

The present inventors carried out intensive investigations to achieve the above object. As a result, it was found that the resin layer including the fluorine-containing cyclic olefin polymer is able to transfer a fine uneven pattern on the mold surface with high precision and is excellent in etching resistance and etching controllability. That is, it was found that it is possible to produce substrates having various uneven shapes with high precision, thereby completing the present invention.

According to the present invention, there is provided a method of producing a substrate with a fine uneven pattern, a resin composition, and a laminate, as shown below.

[1]

A method of producing a substrate with a fine uneven pattern, the method including a step (a) of preparing a laminate provided with a substrate and a first resin layer provided on the substrate and having a first fine uneven pattern formed on a surface thereof; and a step (b) of forming a second fine uneven pattern corresponding to the first fine uneven pattern on the surface of the substrate by etching the surface of the first fine uneven pattern using the first resin layer as a mask, in which the first resin layer is formed of a resin composition (P) including a fluorine-containing cyclic olefin polymer (A) or a cured product of the resin composition (P).

[2]

The method of producing a substrate with a fine uneven pattern according to [1], in which the fluorine-containing cyclic olefin polymer (A) includes a repeating structural unit represented by General Formula (1).

[Chem. 1]

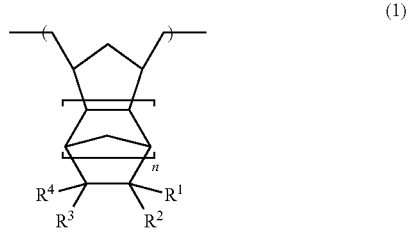

(1)

(In General Formula (1), at least one of $R^1$ to $R^4$ is an organic group selected from fluorine, an alkyl group having 1 to 10 carbon atoms containing fluorine, an alkoxy group having 1 to 10 carbon atoms containing fluorine, an alkoxyalkyl group having 2 to 10 carbon atoms containing fluorine. When $R^1$ to $R^4$ are groups which do not contain fluorine, $R^1$ to $R^4$ are organic groups selected from hydrogen, an alkyl group having 1 to 10 carbon atoms, an alkoxy group having 1 to 10 carbon atoms, and an alkoxyalkyl group having 2 to 10 carbon atoms. $R^1$ to $R^4$ may be the same or different. $R^1$ to $R^4$ may be bonded to each other to form a ring structure. n represents an integer of 0 to 2.)

[3]
The method of producing a substrate with a fine uneven pattern according to [1] or [2], in which the resin composition (P) further includes a photocurable compound (B) and a photocuring initiator (C).

[4]
The method of producing a substrate with a fine uneven pattern according to [3], in which a mass ratio ((A)/(B)) of a content of the fluorine-containing cyclic olefin polymer (A) to a content of the photocurable compound (B) in the resin composition (P) is 1/99 or more and 99/1 or less.

[5]
The method of producing a substrate with a fine uneven pattern according to [3] or [4], in which the photocurable compound (B) includes a ring-opening polymerizable compound capable of cationic polymerization.

[6]
The method of producing a substrate with a fine uneven pattern according to any one of [3] to [5], in which a surface tension of the resin composition (P) including the fluorine-containing cyclic olefin polymer (A) is 20 mN/m or more and 60 mN/m or less, and the step (a) includes a step of coating the resin composition (P) over the substrate using an ink jet coating method to form the first resin layer.

[7]
The method of producing a substrate with a fine uneven pattern according to any one of [1] to [6], in which the step (a) includes a step (a1) of pressing a mold having a fine uneven pattern on the first resin layer which is provided on the substrate and which includes the fluorine-containing cyclic olefin polymer (A) to form a fine uneven pattern corresponding to the fine uneven pattern of the mold.

[8]
The method of producing a substrate with a fine uneven pattern according to [7], in which the step (a) further includes a step (a2) of curing the first resin layer by forming the first fine uneven pattern on the surface of the first resin layer and then carrying out irradiation with light, and a step (a3) of peeling off the mold from the first resin layer.

[9]
The method of producing a substrate with a fine uneven pattern according to any one of [1] to [8], the method further including a step (c) of removing the first resin layer positioned above a protrusion which forms the second fine uneven pattern.

[10]
The method of producing a substrate with a fine uneven pattern according to any one of [1] to [9], in which the substrate is selected from a quartz substrate, a silicon substrate, a nickel substrate, an aluminum substrate, and a sapphire substrate.

[11]
A resin composition for forming the first resin layer in the method of producing a substrate with a fine uneven pattern according to any one of [1] to [10], the resin composition including a fluorine-containing cyclic olefin polymer (A).

[12]
The resin composition according to [11], in which a ratio (($O_2$)/($CHF_3$)) of an etching rate ($O_2$) of $O_2$ gas and an etching rate ($CHF_3$) of $CHF_3$ gas measured by method 1 is 1 or more and 100 or less.

(Method 1: After coating the resin composition over a silicon wafer such that a thickness after curing is in a range of 200 nm or more and 350 nm or less, the obtained coating film is cured. Next, $O_2$ gas plasma etching is performed on the obtained cured film for 10 seconds, 20 seconds, and 30 seconds, respectively, a reduced film thickness amount of the cured film due to the $O_2$ gas plasma etching is calculated, time (sec) is plotted on a horizontal axis and the reduced film thickness amount (nm) is plotted on a vertical axis, and an etching rate ($O_2$) (nm/sec) of the $O_2$ gas is calculated from a slope of the obtained graph. Similarly, $CHF_3$ gas plasma etching is performed on the obtained cured film for 30 seconds, 60 seconds, and 90 seconds, respectively, a reduced film thickness amount of the cured film due to the $CHF_3$ gas plasma etching is calculated, time (sec) is plotted on the horizontal axis and the reduced film thickness amount (nm) is plotted on a vertical axis, and an etching rate ($CHF_3$) (nm/sec) of the $CHF_3$ gas is calculated from a slope of the obtained graph.)

[13]
The resin composition according to [11] or [12], in which a surface tension is 20 mN/m or more and 60 mN/m or less.

[14]
A laminate in the method of producing a substrate with a fine uneven pattern according to any one of [1] to [10], the laminate including a substrate; and a first resin layer provided on the substrate and having a first fine uneven pattern formed on a surface thereof, in which the first resin layer is formed of a resin composition (P) including a fluorine-containing cyclic olefin polymer (A) or a cured product of the resin composition (P).

Advantageous Effects of Invention

According to the present invention, it is possible to obtain a substrate with a fine uneven pattern with excellent dimensional precision.

BRIEF DESCRIPTION OF THE DRAWINGS

The objects described above, other objects, characteristics, and advantages will become clearer from the preferred embodiments described below and the accompanying drawings below.

DESCRIPTION OF EMBODIMENTS

Figure 1:
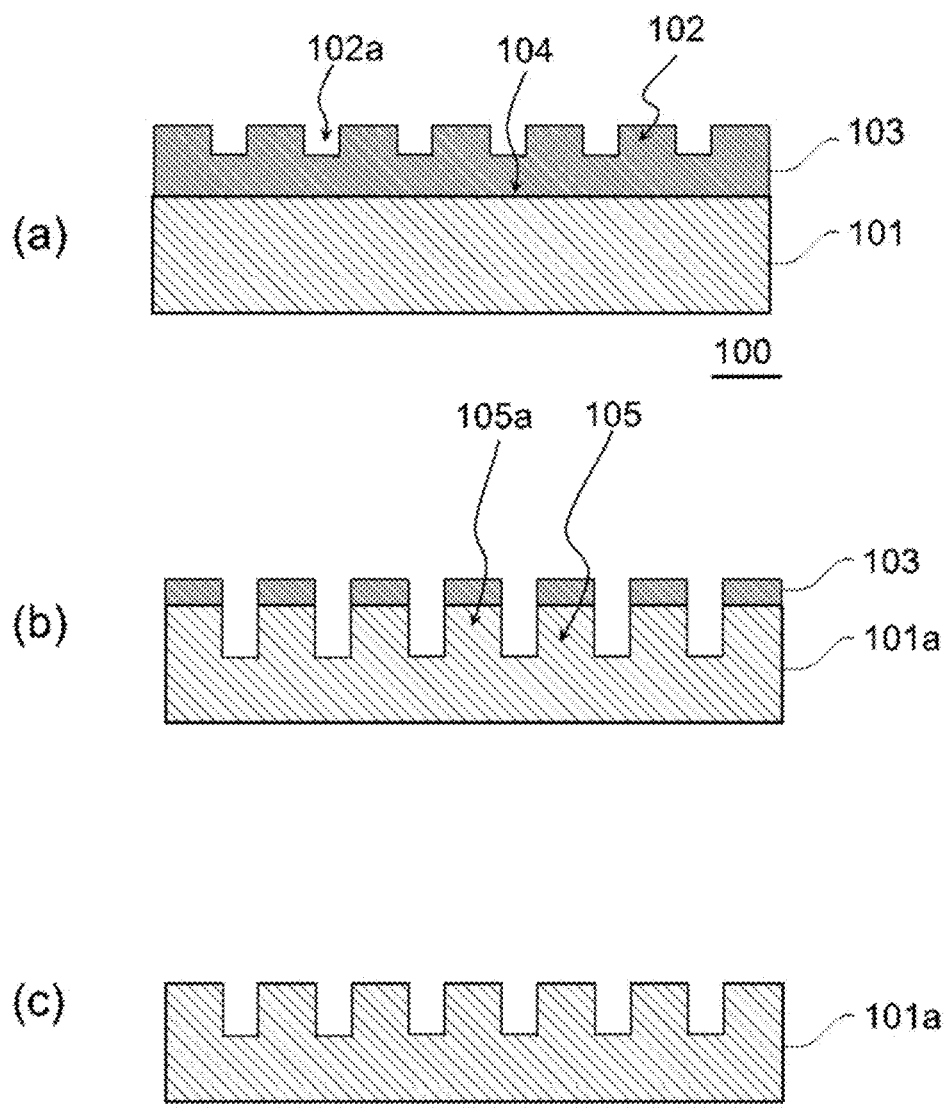
FIG. 1 is a flow chart showing an example of a method of producing a substrate with a fine uneven pattern according to the present invention.

A description will be given below of embodiments of the present invention using the drawings. In all the drawings, the same constituent elements are denoted by the same reference numerals and description thereof will not be repeated. In addition, the diagrams are schematic views and do not match the actual dimensional ratios. In addition, "A to B" in numerical ranges represents A or more and B or less unless otherwise specified. In addition, in the present specification, a picoliter may be described as "pL".

Figure 2:
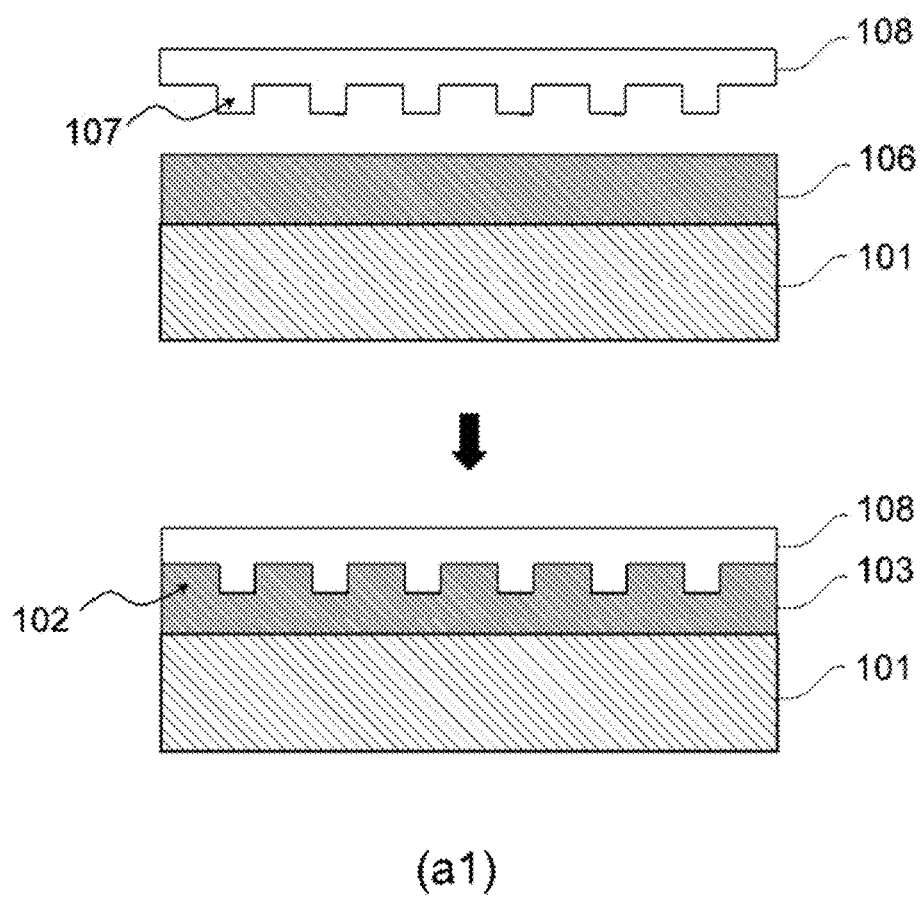
FIG. 2 is a flow chart showing an example of a method of producing a substrate with a fine uneven pattern according to the present invention.
Figure 3:
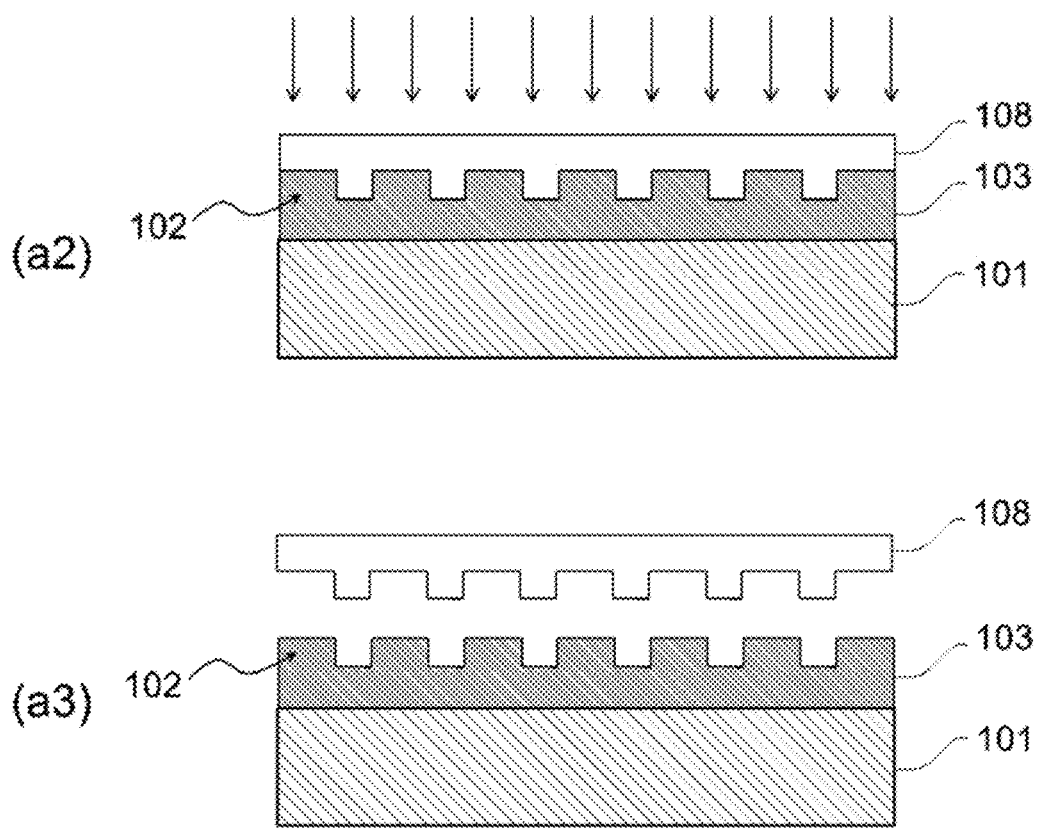
FIG. 3 is a flow chart showing an example of a method of producing a substrate with a fine uneven pattern according to the present invention.

FIGS. 1 to 3 are flow charts showing examples of a method of producing a substrate with a fine uneven pattern according to the present invention.

The method of producing a substrate 101a with a fine uneven pattern according to the present embodiment is a producing method of producing a substrate having a fine uneven pattern on the surface thereof and is provided with at least the two steps below.

Step (a): A step of preparing a laminate 100 provided with a substrate 101 and a first resin layer 103 provided on the substrate 101 and having a first fine uneven pattern 102 formed on the surface thereof Step (b): A step of forming a second fine uneven pattern 105 corresponding to the first fine uneven pattern 102 on the surface 104 of the substrate 101 by etching the surface of the first fine uneven pattern 102 using the first resin layer 103 as a mask The first resin layer 103 is formed of a resin composition (P) including a fluorine-containing cyclic olefin polymer (A) or a cured product of the resin composition (P).

Here, in the present embodiment, the fine uneven pattern means a structure provided with, for example, protrusions and recesses, in which the width of the protrusions and/or recesses is 10 nm to 50 μm, the depth of the recesses and/or the height of the protrusions is 10 nm to 50 μm, and the aspect ratio which is the ratio of the width of the protrusions to the height of the protrusions is 0.1 to 500.

Other examples include shapes such as dome shapes, square columns, columnar shapes, prisms, square pyramids, triangular pyramids, polyhedrons, and hemispheres. In these shapes, preferable examples include a structure in which the depth of the recess and/or the height of the protrusion is 10 nm to 50 μm and the aspect ratio which is the ratio of the width of the protrusion to the height of the protrusion is 0.1 to 500.

According to the investigation of the present inventors, it was found that, in relation to a method for forming a fine uneven pattern on a substrate using a nanoimprint lithography method, a resin layer onto which it is possible to transfer the fine uneven pattern on a mold surface may be inferior in terms of the etching property. In such a case, it is clear that, for example, there are cases where, when the $O_2$ gas plasma etching resistance of the resin layer is small and the resin layer on the substrate surface and the bottom surface of the recess is etched, the protrusions of the pattern are also etched and use as an etching mask for substrate processing is not possible or cases where the etching does not proceed up to the substrate positioned below the resin layer, that is, the etching stops halfway, and it is not possible to form the fine uneven pattern on the surface of the substrate with high precision.

That is, the present inventors found that there is room for improvement in the overall performance (the balance of etching resistance, control, and the like) in relation to etching in a method for forming a fine uneven pattern on a substrate using a nanoimprint lithography method.

The present inventors carried out intensive investigations to achieve the above object. As a result, it was found that it is possible for a resin layer including the fluorine-containing cyclic olefin polymer (A) to transfer a fine uneven pattern on a mold surface with high precision, that is, that the resin layer is excellent in the balance between the etching resistance and etching controllability (for example, the etching progresses stably over time, and the like).

That is, using a resin layer including a fluorine-containing cyclic olefin polymer (A) as a resist layer used in a method for forming a fine uneven pattern on a substrate using a nanoimprint lithography method makes it possible to transfer the fine uneven pattern on the mold surface to the resist layer with high precision and to perform the etching of the resist layer remaining below the recess forming the fine uneven pattern and the subsequent etching of the substrate with high precision.

It is possible for the resin layer including the fluorine-containing cyclic olefin polymer (A) to transfer the fine uneven pattern on the mold surface with high precision and the resin layer has an excellent balance between etching resistance to gas, liquid, and the like for etching the substrate and etching controllability. Having such an etching performance makes it possible to etch a desired position on the substrate when etching a substrate using the resin layer having a fine uneven pattern as a mask, thus, it is possible to transfer the fine uneven pattern formed on the resin layer to the substrate with high precision. Furthermore, since it is possible to reduce the thickness of the resin layer, when etching the fine uneven pattern formed in the resin layer, it is possible to suppress etching of the side walls of the protrusions forming the fine uneven pattern of the resin layer.

As a result, when a resin layer including the fluorine-containing cyclic olefin polymer (A) having the characteristics described above is used as a resist layer in a nanoimprint lithography method, it is possible to impart a fine uneven pattern to a substrate with high precision. In addition, it is possible to obtain a substrate having a specific structure.

As described above, according to the method of producing a substrate with a fine uneven pattern according to the present embodiment, providing step (a) and step (b) described above and using the resin composition (P) including the fluorine-containing cyclic olefin polymer (A) or the cured product of the resin composition (P) as the first resin layer 103 makes it possible to form the fine uneven pattern on the substrate surface with high precision, and, as a result, it is possible to obtain a substrate with a fine uneven pattern with excellent dimensional precision.

1. Resin Composition (P)

Next, a description about the resin composition (P) used by the method of producing a substrate with a fine uneven pattern according to the present embodiment will be given.

The resin composition (P) according to the present embodiment includes a fluorine-containing cyclic olefin polymer (A) as an essential component. In addition, from the viewpoint of imparting photocurability to the obtained first resin layer 103, the resin composition (P) according to the present embodiment preferably further includes the photocurable compound (B) and the photocuring initiator (C). When photocurability is imparted to the first resin layer 103, it is possible to use a so-called photo nanoimprint lithography method, thus, it is possible to minimize the heating step and the cooling step and to suppress dimensional changes and the like when curing the first resin layer 103.

In addition, all the constituent elements of the resin composition (P) according to the present embodiment are preferably formed of an organic compound. In such a case, since the constituent elements of the resin composition (P) according to the present embodiment are all formed of an organic compound and the resin composition (P) has a specific structure, it is possible to further reduce the remaining film with respect to the $O_2$ gas plasma etching carried out in the initial process of the etching process and to further reduce changes in the etching rate with respect to the etching time and, as a result, it is possible to carry out $O_2$ gas plasma etching with even higher controllability. This property is advantageous of producing a substrate with a fine structure.

Furthermore, in the resin composition (P) according to the present embodiment, the ratio $((O_2)/(CHF_3))$ of the etching rate $(O_2)$ of the $O_2$ gas to the etching rate $(CHF_3)$ of $CHF_3$ gas measured by method 1 is preferably 1 or more and 100 or less, more preferably 5 or more and 80 or less, even more preferably 10 or more and 70 or less, still more preferably 15 or more and 70 or less, and particularly preferably 20 or more and 70 or less.

When processing with gas (for example, a fluorine-based $(CHF_3)$ gas) at the time of substrate processing, adjusting the ratio between the etching rates of the oxygen $(O_2)$ gas and the fluorine-based $(CHF_3)$ gas within the above range facilitates control of the influence (referred to as etching damage) on the etching mask formed of the resin layer formed of the resin composition (P) according to the present embodiment and also makes it possible to form an uneven structure on the surface of a processed substrate with high precision.

In a case where $(O_2)/(CHF_3)$ is the upper limit value or less, the etching resistance to oxygen $(O_2)$ gas becomes appropriate and, due to this, the burden of the step of etching the resin layer on the substrate surface and the recess bottom surface by plasma etching such as $O_2$ gas plasma etching carried out in the initial process of the etching process is reduced, and it is possible to improve the productivity. In addition, in a case where $(O_2)/(CHF_3)$ is the lower limit value or more, it is possible to reduce etching damage to the etching mask formed of a resin layer formed of the resin composition (P) according to the present embodiment due to the gas at the time of substrate processing, and the processing of the desired shape on the fabricated substrate surface becomes easy.

(Method 1: After coating a resin composition (P) on a silicon wafer such that a thickness after curing is in a range of 200 nm or more and 350 nm or less, the obtained coating film is cured. Next, $O_2$ gas plasma etching is performed on the obtained cured film for 10 seconds, 20 seconds, and 30 seconds, respectively, a reduced film thickness amount of the cured film due to the $O_2$ gas plasma etching is calculated, time (sec) is plotted on the horizontal axis and the reduced film thickness amount (nm) is plotted on a vertical axis, and an etching rate $(O_2)$ (nm/sec) of the $O_2$ gas is calculated from a slope of the obtained graph. Similarly, $CHF_3$ gas plasma etching is performed on the obtained cured film for 30 seconds, 60 seconds, and 90 seconds, respectively, a reduced film thickness amount of the cured film due to the $CHF_3$ gas plasma etching is calculated, time (sec) is plotted on the horizontal axis and the reduced film thickness amount (nm) is plotted on a vertical axis, and an etching rate $(CHF_3)$ (nm/sec) of the $CHF_3$ gas is calculated from a slope of the obtained graph.)

A description about each component forming the resin composition (P) will be given below.

<Fluorine-Containing Cyclic Olefin Polymer (A)>

The fluorine-containing cyclic olefin polymer (A) according to the present embodiment is a cyclic olefin polymer which contains fluorine, and preferably includes a repeating structural unit represented by General Formula (1). Further examples include fluorine-containing cyclic olefin polymers having a multi-membered ring structure such as a 1,2-norbornane skeleton in the main chain.

Since the fluorine-containing cyclic olefin polymer (A) including a repeating structural unit represented by General Formula (1) has a hydrocarbon structure in the main chain and a fluorine-containing aliphatic ring structure in the side chain, it is possible to form intermolecular or intramolecular hydrogen bonds. Therefore, in a case where the resin composition (P) includes a fluorine-containing cyclic olefin polymer (A) including a repeating structural unit represented by General Formula (1), it is possible to suppress dimensional changes in the resin layer in the heating and cooling processes in the steps of producing the first resin layer 103 on which the first fine uneven pattern 102 is formed on the surface thereof, and, when peeling from the substrate, due to the effect of the fluorine atom and/or the fluorine-containing substituent, it is possible to reduce the surface energy at the interface with the substrate, thus, the releasability is good, and as a result, it is possible to form the first fine uneven pattern 102 on the first resin layer 103 with high dimensional precision.

In addition, the fluorine-containing cyclic olefin polymer (A) has a hydrocarbon structure in the main chain and fluorine or a fluorine-containing substituent in the side chain and thus has a comparatively large polarity in the molecule. Due to this, the compatibility with the photocurable compound (B) is excellent.

[Chem. 2]

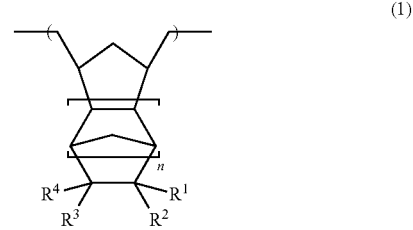

(1)

In General Formula (1), at least one of $R^1$ to $R^4$ is an organic group selected from fluorine, a fluorine-containing alkyl group having 1 to 10 carbon atoms, a fluorine-containing alkoxy group having 1 to 10 carbon atoms, and a fluorine-containing alkoxyalkyl group having 2 to 10 carbon atoms. In a case where $R^1$ to $R^4$ are a group containing no fluorine, $R^1$ to $R^4$ are an organic group selected from hydrogen, an alkyl group having 1 to 10 carbon atoms, an alkoxy group having 1 to 10 carbon atoms, and an alkoxyalkyl group having 2 to 10 carbon atoms. $R^1$ to $R^4$ may be the same or different. $R^1$ to $R^4$ may be bonded to each other to form a ring structure.

n represents an integer of 0 to 2, preferably an integer of 0 to 1, and more preferably 0.

More specific examples of $R^1$ to $R^4$ in General Formula (1) include fluorine; alkyl groups having 1 to 10 carbon atoms in which some or all of the hydrogen of the alkyl group is substituted with fluorine such as a fluoromethyl group, a difluoromethyl group, a trifluoromethyl group, a trifluoroethyl group, a pentafluoroethyl group, a heptafluoropropyl group, a hexafluoroisopropyl group, a heptafluoroisopropyl group, a hexafluoro-2-methylisopropyl group, a perfluoro-2-methylisopropyl group, an n-perfluorobutyl group, an n-perfluoropentyl group, and a perfluorocyclopentyl group; alkoxy groups having 1 to 10 carbon atoms in which some or all of the hydrogen of the alkoxy group is substituted with fluorine such as a fluoromethoxy group, a difluoromethoxy group, a trifluoromethoxy group, a trifluoroethoxy group, a pentafluoroethoxy group, a heptafluoropropoxy group, a hexafluoroisopropoxy group, a heptafluoroisopropoxy group, a hexafluoro-2-methylisopropoxy group, a perfluoro-2-methylisopropoxy group, an n-perfluorobutoxy group, an n-perfluoropentoxy group, and a perfluorocyclopentoxy group; alkoxyalkyl groups having 2 to 10 carbon atoms in which some or all of the hydrogen of the alkoxyalkyl group is substituted with fluorine such as a fluoromethoxymethyl group, a difluoromethoxymethyl group, a trifluoromethoxymethyl group, a trifluoroethoxymethyl group, a pentafluoroethoxymethyl group, a heptafluoropropoxymethyl group, a hexafluoroisopropoxymethyl group, a heptafluoroisopropoxymethyl group, a hexafluoro-2-methylisopropoxymethyl group, a perfluoro-2-methylisopropoxymethyl group, an n-perfluorobutoxymethyl group, an n-perfluoropentoxymethyl group, a perfluorocyclopentoxymethyl group, and the like.

In addition, $R^1$ to $R^4$ may be bonded to each other to form a ring structure, and for example, a ring such as perfluorocycloalkyl or perfluorocycloether may be formed via oxygen.

More specific examples of other $R^1$ to $R^4$ which do not contain fluorine include hydrogen; alkyl groups having 1 to 10 carbon atoms such as a methyl group, an ethyl group, a propyl group, an isopropyl group, a 2-methylisopropyl group, an n-butyl group, n-pentyl, and a cyclopentyl group; alkoxy groups having 1 to 10 carbon atoms such as a methoxy group, an ethoxy group, a propoxy group, a butoxy group, and a pentoxy group; alkoxyalkyl groups having 2 to 10 carbon atoms such as a methoxymethyl group, an ethoxymethyl group, a propoxymethyl group, a butoxymethyl group, and a pentoxymethyl group, and the like.

Among the above, as $R^1$ to $R^4$ in General Formula (1), fluorine; a fluoroalkyl group having 1 to 10 carbon atoms in which some or all of the hydrogen of the alkyl group is substituted with fluorine such as a fluoromethyl group, a difluoromethyl group, a trifluoromethyl group, a trifluoroethyl group, a pentafluoroethyl group, a heptafluoropropyl group, a hexafluoroisopropyl group, a heptafluoroisopropyl group, a hexafluoro-2-methylisopropyl group, a perfluoro-2-methylisopropyl group, an n-perfluorobutyl group, an n-perfluoropentyl group, and a perfluorocyclopentyl group are preferable.

The fluorine-containing cyclic olefin polymer (A) according to the present embodiment may be only the repeating structural unit represented by General Formula (1), or may be formed of two or more of structural units in which at least one of $R^1$ to $R^4$ in General Formula (1) is different from the others.

Furthermore, in the present embodiment, specific examples of the fluorine-containing cyclic olefin polymer (A) containing a repeating structural unit represented by General Formula (1) include poly(1-fluoro-2-trifluoromethyl-3,5-cyclopentylene ethylene), poly(1-fluoro-1-trifluoromethyl-3,5-cyclopentylene ethylene), poly(1-methyl-1-fluoro-2-trifluoromethyl-3,5-cyclopentylene ethylene), poly(1,1-difluoro-2-trifluoromethyl-3,5-cyclopentylene ethylene), poly(1,2-difluoro-2-trifluoromethyl-3,5-cyclopentylene ethylene), poly(1-perfluoroethyl-3,5-cyclopentylene ethylene), poly(1,1-bis(trifluoromethyl)-3,5-cyclopentylene ethylene), poly(1,1,2-trifluoro-2-trifluoromethyl-3,5-cyclopentylene ethylene), poly(1,2-bis(trifluoromethyl)-3,5-cyclopentylene ethylene), poly(1-perfluoropropyl-3,5-cyclopentylene ethylene), poly(1-methyl-2-perfluoropropyl-3,5-cyclopentylene ethylene), poly(1-butyl-2-perfluoropropyl-3,5-cyclopentylene ethylene), poly(1-perfluoro-iso-propyl-3,5-cyclopentylene ethylene), poly(1-methyl-2-perfluoro-iso-propyl-3,5-cyclopentylene ethylene), poly(1,2-difluoro-1,2-bis(trifluoromethyl)-3,5-cyclopentylene ethylene), poly(1,1,2,2,3,3,3a,6a-octafluorocyclopentyl-4,6-cyclopentylene ethylene), poly(1,1,2,2,3,3,4,4,3a,7a-decafluorocyclohexyl-5,7-cyclopentylene ethylene), poly(1-perfluorobutyl-3,5-cyclopentylene ethylene), poly(1-perfluoro-iso-butyl-3,5-cyclopentylene ethylene), poly(1-perfluoro-tert-butyl-3,5-cyclopentylene ethylene), poly(1-methyl-2-perfluoro-iso-butyl-3,5-cyclopentylene ethylene), poly(1-butyl-2-perfluoro-iso-butyl-3,5-cyclopentylene ethylene), poly(1,2-difluoro-1-trifluoromethyl-2-perfluoroethyl-3,5-cyclopentylene ethylene), poly(1-(1-trifluoromethyl-2,2,3,3,4,4,5,5-octafluoro-cyclopentyl)-3,5-cyclopentylene ethylene), poly(1,1,2-trifluoro-2-perfluorobutyl)-3,5-cyclopentylene ethylene), poly(1,2-difluoro-1-trifluoromethyl-2-perfluorobutyl-3,5-cyclopentylene ethylene), poly(1-fluoro-1-perfluoroethyl-2,2-bis(trifluoromethyl)-3,5-cyclopentylene ethylene), poly(1,2-difluoro-1-perfluoropropanyl-2-trifluoromethyl-3,5-cyclopentylene ethylene), poly(1-perfluorohexyl-3,5-cyclopentylene ethylene), poly(1-methyl-2-perfluorohexyl-3,5-cyclopentylene ethylene), poly(1-butyl-2-perfluorohexyl-3,5-cyclopentylene ethylene), poly(1-hexyl-2-perfluorohexyl-3,5-cyclopentylene ethylene), poly(1-octyl-2-perfluorohexyl-3,5-cyclopentylene ethylene), poly(1-perfluoroheptyl-3,5-cyclopentylene ethylene), poly(1-perfluorooctyl-3,5-cyclopentylene ethylene), poly(1-perfluorodecanyl-3,5-cyclopentylene ethylene), poly(1,1,2-trifluoro-perfluoropentyl-3,5-cyclopentylene ethylene), poly(1,2-difluoro-1-trifluoromethyl-2-perfluorobutyl-3,5-cyclopentylene ethylene), poly(1,1,2-trifluoro-perfluorohexyl-3,5-cyclopentylene ethylene), poly(1,2-difluoro-1-trifluoromethyl-2-perfluoropentyl-3,5-cyclopentylene ethylene), poly(1,2-bis(perfluorobutyl)-3,5-cyclopentylene ethylene), poly(1,2-bis(perfluorohexyl)-3,5-cyclopentylene ethylene), poly(1-methoxy-2-trifluoromethyl-3,5-cyclopentylene ethylene), poly(1-tert-butoxymethyl-2-trifluoromethyl-3,5-cyclopentylene ethylene), poly(1,1,3,3,3a, 6a-hexafluorofuranyl-3,5-cyclopentylene ethylene), and the like.

Furthermore, in the present embodiment, specific examples of the fluorine-containing cyclic olefin polymer (A) containing a repeating structural unit represented by General Formula (1) include poly(1-fluoro-2-trifluoromethoxy-3,5-cyclopentylene ethylene), poly(1-fluoro-1-trifluoromethoxy-3,5-cyclopentylene ethylene), poly(1-methyl-1-fluoro-2-trifluoromethoxy-3,5-cyclopentylene ethylene), poly(1,1-difluoro-2-trifluoromethoxy-3,5-cyclopentylene ethylene), poly(1,2-difluoro-2-trifluoromethoxy-3,5-cyclopentylene ethylene), poly(1-perfluoroethoxy-3,5-cyclopentylene ethylene), poly(1,1-bis(trifluoromethoxy)-3,5-cyclopentylene ethylene), poly(1,1,2-trifluoro-2-trifluoromethoxy-3,5-cyclopentylene ethylene), poly(1,2-bis (trifluoromethoxy)-3,5-cyclopentylene ethylene), poly(1-perfluoropropoxy-3,5-cyclopentylene ethylene), poly(1-methyl-2-perfluoropropoxy-3,5-cyclopentylene ethylene), poly(1-butyl-2-perfluoropropoxy-3,5-cyclopentylene ethylene), poly(1-perfluoro-iso-propoxy-3,5-cyclopentylene ethylene), poly(1-methyl-2-perfluoro-iso-propoxy-3,5-cyclopentylene ethylene), poly(1,2-difluoro-1,2-bis(trifluoromethoxy)-3,5-cyclopentylene ethylene), poly(1-perfluorobutoxy-3,5-cyclopentylene ethylene), poly(1-perfluoro-iso-butoxy-3,5-cyclopentylene ethylene), poly(1-perfluoro-tert-butoxy-3,5-cyclopentylene ethylene), poly(1-methyl-2-perfluoro-iso-butoxy-3,5-cyclopentylene ethylene), poly(1-butyl-2-perfluoro-iso-butoxy-3,5-cyclopentylene ethylene), poly(1,2-difluoro-1-trifluoromethoxy-2-perfluoroethoxy-3,5-cyclo pentylene ethylene), poly((1,1,2-trifluoro-2-perfluorobutoxy)-3,5-cyclopentylene ethylene), poly(1,2-difluoro-1-trifluoromethoxy-2-perfluorobutoxy-3,5-cyclo pentylene ethylene), poly(1-fluoro-1-perfluoroethoxy-2,2-bis(trifluoromethoxy)-3,5-cyclopentylene ethylene), poly(1,2-difluoro-1-perfluoropropoxy-2-trifluoromethoxy-3,5-cyclopentylene ethylene), poly(1-perfluorohethoxy-3,5-cyclopentylene ethylene), poly(1-methyl-2-perfluorohethoxy-3,5-cyclopentylene ethylene), poly(1-butyl-2-perfluorohethoxy-3,5-cyclopentylene ethylene), poly(1-hexyl-2-perfluorohethoxy-3,5-cyclopentylene ethylene), poly(1-octyl-2-perfluorohethoxy-3,5-cyclopentylene ethylene), poly(1-perfluoroheptoxy-3,5-cyclopentylene ethylene), poly(1-perfluorooctoxy-3,5-cyclopentylene ethylene), poly(1-perfluorodeoxy-3,5-cyclopentylene ethylene), poly(1,1,2-trifluoro-perfluoropentoxy-3,5-cyclopentylene ethylene), poly(1,2-difluoro-1-trifluoromethoxy-2-perfluorobutoxy-3,5-cyclo pentylene ethylene), poly(1,1,2-trifluoro-2-perfluorohethoxy-3,5-cyclopentylene ethylene), poly(1,2-difluoro-1-trifluoromethoxy-2-perfluoropentyl-3,5-cyclo pentylene ethylene), poly(1,2-bis(perfluorobutoxy)-3,5-cyclopentylene ethylene), poly(1,2-bis(perfluorohethoxy)-3,5-cyclopentylene ethylene), poly(1-methoxy-2-trifluoromethoxy-3,5-cyclopentylene ethylene), poly(1-tert-butoxymethyl-2-trifluoromethoxy-3,5-cyclopentylene ethylene), poly(1-(2',2',2'-trifluoroethoxy)-3,5-cyclopentylene ethylene), poly(1-(2',2',3',3',3'-pentafluoropropoxy)-3,5-cyclopentylene ethylene), poly(1-methyl-2-(2',2',3',3',3'-pentafluoropropoxy)-3,5-cyclopentylene ethylene), poly(1-butyl-2-(2',2',3',3',3'-pentafluoropropoxy)-3,5-cyclopentylene ethylene), poly(1-(1',1',1'-trifluoro-iso-propoxy)-3,5-cyclopentylene ethylene), poly(1-methyl-(1',1',1'-trifluoro-iso-propoxy)-3,5-cyclopentylene ethylene), poly(1-(2',2',3',3',4',4',4'-heptafluorobutoxy)-3,5-cyclopentylene ethylene), poly(1-(1',1',1'-trifluoro-iso-butoxy)-3,5-cyclopentylene ethylene), poly(1-(1',1',1'-trifluoro-iso-butoxy)-3,5-cyclopentylene ethylene), poly(1-methyl-2-(1',1',1'-trifluoro-iso-butoxy)-3,5-cyclopentylene ethylene), poly(1-butyl-2-(1',1',1'-trifluoro-iso-butoxy)-3,5-cyclopentylene ethylene), poly(1,2-difluoro-1-trifluoromethoxy-2-(2',2',2'-trifluoroethoxy)-3,5-cyclopentylene ethylene), poly(1,1,2-trifluoro-2-(2',2',3',3',4',4',4'-heptafluorobutoxy)-3,5-cyclopentylene ethylene), poly(1,2-difluoro-1-trifluoromethoxy-2-(2',2',3',3',4',4',4'-heptafluorobutoxy)-3,5-cyclopentylene ethylene), poly(1-fluoro-1-(2',2',2'-trifluoroethoxy)-2,2-bis(trifluoromethoxy)-3,5-cyclopentylene ethylene), poly(1,2-difluoro-1-(2',2',3',3',3'-pentafluoropropoxy)-2-trifluoromethoxy-3,5-cyclopentylene ethylene), poly(1-(2',2',3',3',4',4',5',5',6',6',6'-undecafluorohethoxy)-3,5-cyclopentylene ethylene), poly(1-methyl-2-(2',2',3',3',4',4',5',5',6',6',6'-undecafluorohethoxy)-3,5-cyclopentylene ethylene), poly(1-butyl-2-(2',2',3',3',4',4',5',5',6',6',6'-undecafluorohethoxy)-3,5-cyclopentylene ethylene), poly(1-hexyl-2-(2',2',3',3',4',4',5',5',6',6',6'-undecafluorohethoxy)-3,5-cyclopentylene ethylene), poly(1-octyl-2-(2',2',3',3',4',4',5',5',6',6',6'-undecafluorohethoxy)-3,5-cyclopentylene ethylene), poly(1-(2',2',3',3',4',4',5',5',6',6',7',7',7'-tridecafluoroheptoxy)-3,5-cyclopentylene ethylene), poly(1-(2',2',3',3',4',4',5',5',6',6',7',7',8',8',8'-pentadecafluorooctoxy)-3,5-cyclopentylene ethylene), poly(1-(2',2',3',3',4',4',5',5',6',6',7',7',8',8',9',9',9'-hepta decafluorodeoxy)-3,5-cyclopentylene ethylene), poly(1,1,2-trifluoro-2-(1',1',1'-trifluoro-iso-propoxy)-3,5-cyclopentylene ethylene), poly(1,2-difluoro-1-trifluoromethoxy-2-(2',2',3',3',4',4',4'-heptafluorobutoxy)-3,5-cyclopentylene ethylene), poly(1,1,2-trifluoro-(2',2',3',3',4',4',5',5',6',6',6'-undecafluorohethoxy)-3,5-cyclopentylene ethylene), poly(1,2-bis(2',2',3',3',4',4',4'-heptafluorobutoxy)-3,5-cyclopentylene ethylene), poly(1,2-bis(2',2',3',3',4',4',5',5',6',6',6'-undecafluorohethoxy)-3,5-cyclopentylene ethylene), and the like.

Furthermore, in the present embodiment, specific examples of the fluorine-containing cyclic olefin polymer (A) containing the repeating structural unit represented by General Formula (1) include poly(3-fluoro-4-trifluoromethyl-7,9-tricyclo[4.3.0.1$^{2,5}$]decanylene ethylene), poly(3-fluoro-3-trifluoromethyl-7,9-tricyclo[4.3.0.1$^{2,5}$]decanylene ethylene), poly(3-methyl-3-fluoro-4-trifluoromethyl-7,9-tricyclo[4.3.0.1$^{2,5}$]decanylene ethylene), poly(3,3-difluoro-4-trifluoromethyl-7,9-tricyclo[4.3.0.1$^{2,5}$]decanylene ethylene), poly(3,4-difluoro-4-trifluoromethyl-7,9-tricyclo[4.3.0.1$^{2,5}$]decanylene ethylene), poly(3-perfluoroethyl-7,9-tricyclo[4.3.0.1$^{2,5}$]decanylene ethylene), poly(3,3-bis(trifluoromethyl)-7,9-tricyclo[4.3.0.1$^{2,5}$]decanylene ethylene), poly(3,3,4-trifluoro-4-trifluoromethyl-7,9-tricyclo[4.3.0.1$^{2,5}$]decanylene ethylene), poly(3,4-bistrifluoromethyl-7,9-tricyclo[4.3.0.1$^{2,5}$]decanylene ethylene), poly(3-perfluoropropyl-7,9-tricyclo[4.3.0.1$^{2,5}$]decanylene ethylene), poly(3-methyl-4-perfluoropropyl-7,9-tricyclo[4.3.0.1$^{2,5}$]decanylene ethylene), poly(3-butyl-4-perfluoropropyl-7,9-tricyclo[4.3.0.1$^{2,5}$]decanylene ethylene), poly(3-perfluoro-iso-propyl-7,9-tricyclo[4.3.0.1$^{2,5}$]decanylene ethylene), poly(3-methyl-9-perfluoro-iso-propyl-7,9-tricyclo[4.3.0.1$^{2,5}$]decanylene ethylene), poly(3,4-difluoro-3,4-bis(trifluoromethyl)-7,9-tricyclo[4.3.0.1$^{2,5}$]decanylene ethylene), poly(2,3,3,4,4,5,5,6-octafluoro-9,11-tetracyclo[5.5.1.0$^{2,6}$.0$^{8,12}$]tridecanylene ethylene), poly(2,3,3,4,4,5,5,6,6,7-decafluoro-10,12-tetracyclo[6.5.1.0$^{2,7}$.0$^{9,13}$]tetradecanylene ethylene), poly(3-perfluorobutyl-7,9-tricyclo[4.3.0.1$^{2,5}$]decanylene ethylene), poly(3-perfluoro-iso-butyl-7,9-tricyclo[4.3.0.1$^{2,5}$]decanylene ethylene), poly(3-perfluoro-tert-butyl-7,9-tricyclo[4.3.0.1$^{2,5}$]decanylene ethylene), poly(3-methyl-4-perfluoro-tert-butyl-7,9-tricyclo[4.3.0.1$^{2,5}$]decanylene ethylene), poly(3-butyl-4-perfluoro-tert-butyl-7,9-tricyclo[4.3.0.1$^{2,5}$]decanylene ethylene), poly(3,4-dimethyl-3-perfluoro-tert-butyl-7,9-tricyclo[4.3.0.1$^{2,5}$]decanylene ethylene), poly(3,3,4-trifluoro-4-perfluorobutyl-7,9-tricyclo[4.3.0.1$^{2,5}$]decanylene ethylene), poly(3,4-difluoro-3-trifluoromethyl-4-perfluorobutyl-7,9-tricyclo[4.3.0.1$^{2,5}$]decanylene ethylene), poly(3-fluoro-3-perfluoroethyl-4,4-bis(trifluoromethyl)-7,9-tricyclo[4.3.0.1$^{2,5}$]decanylene ethylene), poly(3,4-difluoro-3-perfluoropropanyl-4-trifluoromethyl-7,9-tricyclo[4.3.0.1$^{2,5}$]decanylene ethylene), poly(3-perfluorohexyl-7,9-tricyclo[4.3.0.1$^{2,5}$]decanylene ethylene), poly(3-methyl-4-perfluorohexyl-7,9-tricyclo[4.3.0.1$^{2,5}$]decanylene ethylene), poly(3-butyl-4-perfluorohexyl-7,9-tricyclo[4.3.0.1$^{2,5}$]decanylene ethylene), poly(3-hexyl-4-perfluorohexyl-7,9-tricyclo[4.3.0.1$^{2,5}$]decanylene ethylene), poly(3-octyl-4-perfluorohexyl-7,9-tricyclo[4.3.0.1$^{2,5}$]decanylene ethylene), poly(3-perfluoroheptyl-7,9-tricyclo[4.3.0.1$^{2,5}$]decanylene ethylene), poly(3-perfluorodecanyl-7,9-tricyclo[4.3.0.1$^{2,5}$]decanylene ethylene), poly(3,3,4-trifluoro-4-perfluoropentyl-7,9-tricyclo[4.3.0.1$^{2,5}$]decanylene ethylene), poly(3,4-difluoro-3-trifluoromethyl-4-perfluorobutyl-7,9-tricyclo[4.3.0.1$^{2,5}$]decanylene ethylene), poly(3,3,4-trifluoro-3-perfluorohexyl-7,9-tricyclo[4.3.0.1$^{2,5}$]decanylene ethylene), poly(3,4-difluoro-3-trifluoromethyl-4-perfluoropentyl-7,9-tricyclo[4.3.0.1$^{2,5}$]decanylene ethylene), poly(3,4-bis(perfluorobutyl)-7,9-tricyclo[4.3.0.1$^{2,5}$]decanylene ethylene), poly(3,4-bis(perfluorohexyl)-7,9-tricyclo[4.3.0.1$^{2,5}$]decanylene ethylene), poly(3-methoxy-4-trifluoromethyl-7,9-tricyclo[4.3.0.1$^{2,5}$]decanylene ethylene), poly(3-tert-butoxymethyl-4-trifluoromethyl-7,9-tricyclo[4.3.0.1$^{2,5}$]decanylene ethylene), poly(4-fluoro-5-trifluoromethyl-10,12-pentacyclo[6.5.1.0$^{2,7}$.0$^{9,13}$.1$^{3,6}$]pentadecanylene ethylene), poly(4-methyl-5-fluoro-5-trifluoromethyl-10,12-pentacyclo[6.5.1.0$^{2,7}$.0$^{9,13}$.1$^{3,6}$]pentadecanylene ethylene), poly(4,4-difluoro-5-trifluoromethyl-10,12-pentacyclo[6.5.1.0$^{2,7}$.0$^{9,13}$.1$^{3,6}$]pentadecanylene ethylene), poly(4-perfluoroethyl-10,12-pentacyclo[6.5.1.0$^{2,7}$.0$^{9,13}$.1$^{3,6}$]pentadecanylene ethylene), poly(4,4-bis(trifluoromethyl)-10,12-pentacyclo[6.5.1.0$^{2,7}$.0$^{9,13}$.1$^{3,6}$]pentadecanylene ethylene), poly(4,4,5-trifluoro-5-trifluoromethyl-10,12-pentacyclo[6.5.1.0$^{2,7}$.0$^{9,3}$.1$^{3,6}$]pentadecanylene ethylene), poly(4,5-bis(trifluoromethyl)-10,12-pentacyclo[6.5.1.0$^{2,7}$.0$^{9,13}$1$^{3,6}$]pentadecanylene ethylene, poly(4-perfluoropropyl-10,12-pentacyclo[6.5.1.0$^{2,7}$.0$^{9,13}$.1$^{3,6}$]pentadecanylene ethylene), poly(4-methyl-5-perfluoropropyl-10,12-pentacyclo[6.5.1.0$^{2,7}$.0$^{9,13}$.1$^{3,6}$]pentadecanylene ethylene), poly(4-methyl-5-perfluoropropyl-10,12-pentacyclo[6.5.1.0$^{2,7}$.0$^{9,13}$.1$^{3,6}$]pentadecanylene ethylene), poly(4-butyl-5-perfluoropropyl-10,12-pentacyclo[6.5.1.0$^{2,7}$.0$^{9,13}$.1$^{3,6}$]pentadecanylene ethylene), poly(4-perfluoro-iso-propyl-10,12-pentacyclo[6.5.1.0$^{2,7}$.0$^{9,13}$.1$^{3,6}$]pentadecanylene ethylene), poly(4-methyl-5-perfluoro-iso-propyl-10,12-pentacyclo[6.5.1.0$^{2,7}$.0$^{9,13}$.1$^{3,6}$]pentadecanylene ethylene), poly(4,5-difluoro-4,5-bis(trifluoromethyl)-10,12-pentacyclo[6.5.1.0$^{2,7}$.0$^{9,13}$.1$^{3,6}$]pentadecanylene ethylene), poly(3,4,4,5,5,6,6,7-octafluoro-12,14-hexacyclo[7.7.0.1$^{2,8}$.1$^{10,16}$.0$^{3,7}$.0$^{11,15}$]octadecanylene ethylene), poly(3,4,4,5,5,6,6,7,7,8-decafluoro-13,15-hexacyclo[8.7.0.1$^{2,9}$.1$^{11,17}$.0$^{3,8}$.0$^{12,16}$]nonadecanylene ethylene), poly(4-perfluorobutyl-10,12-pentacyclo[6.5.1.0$^{2,7}$.0$^{9,13}$.1$^{3,6}$]pentadecanylene ethylene), poly(4-perfluoro-iso-butyl-10,12-pentacyclo[6.5.1.0$^{2,7}$.0$^{9,13}$.1$^{3,6}$]pentadecanylene ethylene), poly(4-methyl-5-tert-butyl-10,12-pentacyclo[6.5.1.0$^{2,7}$.0$^{9,13}$.1$^{3,6}$]pentadecanylene ethylene), poly(4-butyl-5-tert-butyl-10,12-pentacyclo[6.5.1.0$^{2,7}$.0$^{9,13}$.1$^{3,6}$]pentadecanylene ethylene), poly(4,5-methyl-4-tert-butyl-10,12-pentacyclo[6.5.1.0$^{2,7}$.0$^{9,13}$.1$^{3,6}$]pentadecanylene ethylene), poly(4,4,5-trifluoro-6-perfluorobutyl-10,12-pentacyclo[6.5.1.0$^{2,7}$.0$^{9,13}$.1$^{3,6}$]pentadecanylene ethylene), poly(4,6-difluoro-4-trifluoromethyl-5-perfluorobutyl-10,12-pentacyclo[6.5.1.0$^{2,7}$.0$^{9,13}$.1$^{3,6}$]pentadecanylene ethylene), poly(4-fluoro-4-perfluoroethyl-5,5-bis(trifluormethyl)-10,12-pentacyclo[6.5.1.0$^{2,7}$.0$^{9,13}$.1$^{3,6}$]pentadecanylene ethylene), poly(4,5-difluoro-4-perfluoropropanyl-5-trifluoromethyl-10,12-pentacyclo[6.5.1.0$^{2,7}$.0$^{9,13}$.1$^{3,6}$]pentadecanylene ethylene), poly(4-perfluorohexyl-10,12-pentacyclo[6.5.1.0$^{2,7}$.0$^{9,13}$.1$^{3,6}$]pentadecanylene ethylene), poly(4-methyl-5-perfluorohexyl-10,12-pentacyclo[6.5.1.0$^{2,7}$.0$^{9,13}$.1$^{3,6}$]pentadecanylene ethylene), poly(4-butyl-5-perfluorohexyl-10,12-pentacyclo[6.5.1.0$^{2,7}$.0$^{9,13}$.1$^{3,6}$]pentadecanylene ethylene), poly(4-hexyl-5-perfluorohexyl-10,12-pentacyclo[6.5.1.0$^{2,7}$.0$^{9,13}$.1$^{3,6}$]pentadecanylene ethylene), poly(4-octyl-5-perfluorohexyl-10,12-pentacyclo[6.5.1.0$^{2,7}$.0$^{9,13}$.1$^{3,6}$]pentadecanylene ethylene), poly(4-perfluoroheptyl-10,12-pentacyclo[6.5.1.0$^{2,7}$.0$^{9,13}$.1$^{3,6}$]pentadecanylene ethylene), poly(4-perfluorooctyl-10,12-pentacyclo[6.5.1.0$^{2,7}$.0$^{9,13}$.1$^{3,6}$]pentadecanylene ethylene), poly(4-perfluorodecanyl-10,12-pentacyclo[6.5.1.0$^{2,7}$.0$^{9,13}$.1$^{3,6}$]pentadecanylene ethylene), poly(4,4,5-trifluoro-6-perfluoropentyl-10,12-pentacyclo[6.5.1.0$^{2,7}$.0$^{9,13}$.1$^{3,6}$]pentadecanylene ethylene), poly(4,5-difluoro-4-trifluoromethyl-6-perfluorobutyl-10,12-pentacyclo[6.5.1.0$^{2,7}$.0$^{9,13}$.1$^{3,6}$]pentadecanylene ethylene), poly(4,4,5-trifluoro-12-perfluorohexyl-10,12-pentacyclo[6.5.1.0$^{2,7}$.0$^{9,13}$.1$^{3,6}$]pentadecanylene ethylene), poly(4,5-difluoro-4-trifluoromethyl-5-perfluoropentyl-10,12-pentacyclo[6.5.1.0$^{2,7}$.0$^{9,13}$.1$^{3,6}$]pentadecanylene ethylene), poly(4,4,5-tris(trifluoromethyl)-5-perfluoro-tert-butyl-10,12-pentacyclo[6.5.1.0$^{2,7}$.0$^{9,13}$.1$^{3,6}$]pentadecanylene ethylene), poly(4,5-bis(perfluorohexyl)-10,12-pentacyclo[6.5.1.0$^{2,7}$.0$^{9,13}$.1$^{3,6}$]pentadecanylene ethylene), poly(4-methoxy-5-trifluoromethyl-10,12-pentacyclo[6.5.1.0$^{2,7}$.0$^{9,13}$.1$^{3,6}$]pentadecanylene ethylene), poly(3-fluoro-4-trifluoromethoxy-7,9-tricyclo[4.3.0.1$^{2,5}$]decanylene ethylene), poly(3-fluoro-4-trifluoromethoxy-7,9-tricyclo[4.3.0.1$^{2,5}$]decanylene ethylene), poly(3-methyl-3-fluoro-4-trifluoromethoxy-7,9-tricyclo[4.3.0.1$^{2,5}$]decanylene ethylene), poly(3,3-difluoro-4-trifluoromethoxy-7,9-tricyclo[4.3.0.1$^{2,5}$]decanylene ethylene), poly(3,4-difluoro-4-trifluoromethoxy-7,9-tricyclo[4.3.0.1$^{2,5}$]decanylene ethylene), poly(3-perfluoroethoxy-7,9-tricyclo[4.3.0.1$^{2,5}$]decanylene ethylene), poly(3,3,4-trifluoro-4-trifluoromethoxy-7,9-tricyclo[4.3.0.1$^{2,5}$]decanylene ethylene), poly(3,4-bis(trifluoromethoxy)-7,9-tricyclo[4.3.0.1$^{2,5}$]decanylene ethylene), poly(3-perfluoropropoxy-7,9-tricyclo[4.3.0.1$^{2,5}$]decanylene ethylene), poly(3-methyl-4-perfluoropropoxy-7,9-tricyclo[4.3.0.1$^{2,5}$]decanylene ethylene), poly(3-butyl-4-perfluoropropoxy-7,9-tricyclo[4.3.0.1$^{2,5}$]decanylene ethylene), poly(3-perfluoro-iso-propoxy-7,9-tricyclo[4.3.0.1$^{2,5}$]decanylene ethylene), poly(3-methyl-4-perfluoro-iso-propoxy-7,9-tricyclo[4.3.0.1$^{2,5}$]decanylene ethylene), poly(3,4-difluoro-3,4-bis(trifluoromethoxy)-7,9-tricyclo[4.3.0.1$^{2,5}$]decanylene ethylene), poly(3-perfluorobutoxy-7,9-tricyclo[4.3.0.1$^{2,5}$]decanylene ethylene), poly(3-perfluoro-iso-butoxy-7,9-tricyclo[4.3.0.1$^{2,5}$]decanylene ethylene), poly(3-perfluoro-tert-7,9-tricyclo[4.3.0.1$^{2,5}$]decanylene ethylene), poly(3-methyl-4-perfluoro-iso-butoxy-7,9-tricyclo[4.3.0.1$^{2,5}$]decanylene ethylene), poly(3-butyl-4-perfluoro-iso-butoxy-7,9-tricyclo[4.3.0.1$^{2,5}$]decanylene ethylene), poly(3,4-difluoro-3-trifluoromethoxy-4-perfluoroethoxy-7,9-tricyclo[4.3.0.1$^{2,5}$]decanylene ethylene), poly((3,3,4-trifluoro-4-perfluorobutoxy)-7,9-tricyclo[4.3.0.1$^{2,5}$]decanylene ethylene), poly(3,4-difluoro-3-trifluoromethoxy-4-perfluorobutoxy-7,9-tricyclo[4.3.0.1$^{2,5}$]decanylene ethylene), poly(3-fluoro-3-perfluoroethoxy-2,2-bis(trifluoromethoxy)-7,9-tricyclo[4.3.0.1$^{2,5}$]decanylene ethylene), poly(3,4-difluoro-3-perfluoropropoxy-4-trifluoromethoxy-7,9-tricyclo[4.3.0.1$^{2,5}$]decanylene ethylene), poly(3-perfluorohethoxy-7,9-tricyclo[4.3.0.1$^{2,5}$]decanylene ethylene), poly(3-methyl-4-perfluorohethoxy-7,9-tricyclo[4.3.0.1$^{2,5}$]decanylene ethylene), poly(3-butyl-4-perfluorohethoxy-7,9-tricyclo[4.3.0.1$^{2,5}$]decanylene ethylene), poly(3-hexyl-4-perfluorohethoxy-7,9-tricyclo[4.3.0.1$^{2,5}$]decanylene ethylene), poly(3-octyl-4-perfluorohethoxy-7,9-tricyclo[4.3.0.1$^{2,5}$]decanylene ethylene), poly(3-perfluoroheptoxy-7,9-tricyclo[4.3.0.1$^{2,5}$]decanylene ethylene), poly(3-perfluorooctoxy-7,9-tricyclo[4.3.0.1$^{2,5}$]decanylene ethylene), poly(3-perfluorodeoxy-7,9-tricyclo[4.3.0.1$^{2,5}$]decanylene ethylene), poly(3,3,4-trifluoro-perfluoropentoxy-7,9-tricyclo[4.3.0.1$^{2,5}$]decanylene ethylene), poly(3,4-difluoro-3-trifluoromethoxy-4-perfluorobutoxy-7,9-tricyclo[4.3.0.1$^{2,5}$]decanylene ethylene), poly(3,3,4-trifluoro-4-perfluorohexyl-7,9-tricyclo[4.3.0.1$^{2,5}$]decanylene ethylene), poly(3,4-difluoro-3-trifluoromethoxy-4-perfluoropentyl-7,9-tricyclo[4.3.0.1$^{2,5}$]decanylene ethylene), poly(3,4-bis(perfluorobutoxy)-7,9-tricyclo[4.3.0.1$^{2,5}$]decanylene ethylene), poly(3,4-bis(perfluorohethoxy)-7,9-tricyclo[4.3.0.1$^{2,5}$]decanylene ethylene), poly(3-methoxy-4-trifluoromethoxy-7,9-tricyclo[4.3.0.1$^{2,5}$]decanyl ene ethylene), poly(3-tert-butoxymethyl-4-trifluoromethoxy-7,9-tricyclo[4.3.0.1$^{2,5}$]decanylene ethylene), poly(3-(2',2',2'-trifluoroethoxy)-7,9-tricyclo[4.3.0.1$^{2,5}$]decanyl ene ethylene), poly(3-(2',2',3',3',3'-pentafluoropropoxy)-7,9-tricyclo[4.3.0.1$^{2,5}$]decanylene ethylene), poly(3-methyl-4-(2',2',3',3',3'-pentafluoropropoxy)-7,9-tricyclo[4.3.0.1$^{2,5}$]decanylene ethylene), poly(3-butyl-4-(2',2',3',3',3'-pentafluoropropoxy)-7,9-tricyclo[4.3.0.1$^{2,5}$]decanylene ethylene), poly(3-(1',1',1'-trifluoro-iso-propoxy)-7,9-tricyclo[4.3.0.1$^{2,5}$]decanylene ethylene), poly(3-methyl-(1',1',1'-trifluoro-iso-propoxy)-7,9-tricyclo[4.3.0.1$^{2,5}$]decanylene ethylene), poly(3-(2',2',3',3',4',4',4'-heptafluorobutoxy)-7,9-tricyclo[4.3.0.1$^{2,5}$]decanylene ethylene), poly(3-(1',1',1'-trifluoro-iso-butoxy)-7,9-tricyclo[4.3.0.1$^{2,5}$]decanylene ethylene), poly(3-methyl-4-(1',1',1'-trifluoro-iso-butoxy)-7,9-tricyclo[4.3.0.1$^{2,5}$]decanylene ethylene), poly(3-butyl-4-(1',1',1'-trifluoro-iso-butoxy)-7,9-tricyclo[4.3.0.1$^{2,5}$]decanylene ethylene), poly(3,4-difluoro-3-trifluoromethoxy-4-(2',2',2'-trifluoroethoxy)-7,9-tricyclo[4.3.0.1$^{2,5}$]decanylene ethylene), poly(3,3,4-trifluoro-4-(2',2',3',3',4',4',4'-heptafluorobutoxy)-7,9-tricyclo[4.3.0.1$^{2,5}$]decanylene ethylene), poly(3,4-difluoro-3-trifluoromethoxy-4-(2',2',3',3',4',4',4'-heptafluorobutoxy)-7,9-tricyclo[4.3.0.1$^{2,5}$]decanylene ethylene), poly(3-fluoro-3-(2',2',2'-trifluoroethoxy)-4,4-bis(trifluoromethoxy)-7,9-tricyclo[4.3.0.1$^{2,5}$]decanylene ethylene), poly(3,4-difluoro-3-(2',2',3',3',3'-pentafluoropropoxy)-4-trifluoromethoxy-7,9-tricyclo[4.3.0.1$^{2,5}$]decanylene ethylene), poly(3-(2',2',3',3',4',4',5',5',6',6',6'-undecafluorohethoxy)-7,9-tricyclo[4.3.0.1$^{2,5}$]decanylene ethylene), poly(3-methyl-4-(2',2',3',3',4',4',5',5',6',6',6'-undecafluorohethoxy)-7,9-tricyclo[4.3.0.1$^{2,5}$]decanylene ethylene), poly(3-butyl-4-(2',2',3',3',4',4',5',5',6',6',6'-undecafluorohethoxy)-7,9-tricyclo[4.3.0.1$^{2,5}$]decanylene ethylene), poly(3-hexyl-4-(2',2',3',3',4',4',5',5',6',6',6'-undecafluorohethoxy)-7,9-tricyclo[4.3.0.1$^{2,5}$]decanylene ethylene), poly(3-octyl-4-(2',2',3',3',4',4',5',5',6',6',6'-undecafluorohethoxy)-7,9-tricyclo[4.3.0.1$^{2,5}$]decanylene ethylene), poly(3-(2',2',3',3',4',4',5',5',6',6',7',7',7'-tridecafluoroheptoxy)-7,9-tricyclo[4.3.0.1$^{2,5}$]decanylene ethylene), poly(3-(2',2',3',3',4',4',5',5',6',6',7',7',8',8',8'-pentadecafluorooctoxy)-7,9-tricyclo[4.3.0.1$^{2,5}$]decanylene ethylene), poly(3-(2',2',3',3',4',4',5',5',6',6',7',7',8',8',9',9',9'-hepta decafluorodeoxy)-7,9-tricyclo[4.3.0.1$^{2,5}$]decanylene ethylene), poly(3,3,4-trifluoro-4-(1',1',1'-trifluoro-iso-propoxy)-7,9-tricyclo[4.3.0.1$^{2,5}$]decanylene ethylene), poly(3,4-difluoro-3-trifluoromethoxy-4-(2',2',3',3',4',4',4'-heptafluorobutoxy)-7,9-tricyclo[4.3.0.1$^{2,5}$]decanylene ethylene), poly(3,3,4-trifluoro-(2',2',3',3',4',4',5',5',6',6',6'-undecafluorohethoxy)-7,9-tricyclo[4.3.0.1$^{2,5}$]decanylene ethylene), poly(3,4-bis(2',2',3',3',4',4',4'-heptafluorobutoxy)-7,9-tricyclo[4.3.0.1$^{2,5}$]decanylene ethylene), poly(3,4-bis(2',2',3',3',4',4',5',5',6',6',6'-undecafluorohethoxy)-7,9-tricyclo[4.3.0.1$^{2,5}$]decanylene ethylene), poly(4-fluoro-5-trifluoromethoxy-10,12-pentacyclo[6.5.1.0$^{2,7}$.0$^{9,13}$.1$^{3,6}$]pentadecanylene ethylene), poly(4-fluoro-5-trifluoromethoxy-10,12-pentacyclo[6.5.1.0$^{2,7}$.0$^{9,13}$.1$^{3,6}$]pentadecanylene ethylene), poly(4-methyl-4-fluoro-5-trifluoromethoxy-10,12-pentacyclo[6.5.1.0$^{2,7}$.0$^{9,13}$.1$^{3,6}$]pentadecanylene ethylene), poly(4,4-difluoro-5-trifluoromethoxy-10,12-pentacyclo[6.5.1.0$^{2,7}$.0$^{9,13}$.1$^{3,6}$]pentadecanylene ethylene), poly(4,5-difluoro-5-trifluoromethoxy-10,12-pentacyclo[6.5.1.0$^{2,7}$.0$^{9,13}$.1$^{3,6}$]pentadecanylene ethylene), poly(4-perfluoroethoxy-7,9-tricyclo[4.3.0.1$^{2,5}$]decanylene ethylene), poly(4,4,5-trifluoro-5-trifluoromethoxy-10,12-pentacyclo[6.5.1.0$^{2,7}$.0$^{9,13}$.1$^{3,6}$]pentadecanylene ethylene), poly(4,5-bis(trifluoromethoxy)-10,12-pentacyclo[6.5.1.0$^{2,7}$.0$^{9,13}$.1$^{3,6}$]pentadecanylene ethylene), poly(4-perfluoropropoxy-10,12-pentacyclo[6.5.1.0$^{2,7}$.0$^{9,13}$.1$^{3,6}$]pentadecanylene ethylene), poly(4-methyl-5-perfluoropropoxy-10,12-pentacyclo[6.5.1.0$^{2,7}$.0$^{9,13}$.1$^{3,6}$]pentadecanylene ethylene), poly(4-butyl-5-perfluoropropoxy-10,12-pentacyclo[6.5.1.0$^{2,7}$.0$^{9,13}$.1$^{3,6}$]pentadecanylene ethylene), poly(4-perfluoro-iso-propoxy-10,12-pentacyclo[6.5.1.0$^{2,7}$.0$^{9,13}$.1$^{3,6}$]pentadecanylene ethylene), poly(4-methyl-5-perfluoro-iso-propoxy-10,12-pentacyclo[6.5.1.0$^{2,7}$.0$^{9,13}$.1$^{3,6}$]pentadecanylene ethylene), poly(4,5-difluoro-4,5-bis(trifluoromethoxy)-10,12-pentacyclo[6.5.1.0$^{2,7}$.0$^{9,13}$.1$^{3,6}$]pentadecanylene ethylene), poly(4-perfluorobutoxy-10,12-pentacyclo[6.5.1.0$^{2,7}$.0$^{9,13}$.1$^{3,6}$]pentadecanylene ethylene), poly(4-perfluoro-iso-butoxy-10,12-pentacyclo[6.5.1.0$^{2,7}$.0$^{9,13}$.1$^{3,6}$]pentadecanylene ethylene), poly(4-perfluoro-tert-10,12-pentacyclo[6.5.1.0$^{2,7}$.0$^{9,13}$.1$^{3,6}$]pentadecanylene ethylene), poly(4-methyl-5-perfluoro-iso-butoxy-10,12-pentacyclo[6.5.1.0$^{2,7}$.0$^{9,13}$.1$^{3,6}$]pentadecanylene ethylene), poly(4-butyl-5-perfluoro-iso-butoxy-10,12-pentacyclo[6.5.1.0$^{2,7}$.0$^{9,13}$.1$^{3,6}$]pentadecanylene ethylene), poly(4,5-difluoro-4-trifluoromethoxy-5-perfluoroethoxy-10,12-pentacyclo[6.5.1.0$^{2,7}$.0$^{9,13}$.1$^{3,6}$]pentadecanylene ethylene), poly((4,4,5-trifluoro-5-perfluorobutoxy)-10,12-pentacyclo[6.5.1.0$^{2,7}$.0$^{9,13}$.1$^{3,6}$]pentadecanylene ethylene), poly(4,5-difluoro-4-trifluoromethoxy-5-perfluorobutoxy-10,12-pentacyclo[6.5.1.0$^{2,7}$.0$^{9,13}$.1$^{3,6}$]pentadecanylene ethylene), poly(4-fluoro-4-perfluoroethoxy-5,5-bis(trifluoromethoxy)-10,12-pentacyclo[6.5.1.0$^{2,7}$.0$^{9,13}$.1$^{3,6}$]pentadecanylene ethylene), poly(4,5-difluoro-4-perfluoropropoxy-5-trifluoromethoxy-10,12-pentacyclo[6.5.1.0$^{2,7}$.0$^{9,13}$.1$^{3,6}$]pentadecanylene ethylene), poly(4-perfluorohexoxy-10,12-pentacyclo[6.5.1.0$^{2,7}$.0$^{9,13}$.1$^{3,6}$]pentadecanylene ethylene), poly(4-methyl-5-perfluorohethoxy-10,12-pentacyclo[6.5.1.0$^{2,7}$.0$^{9,13}$.1$^{3,6}$]pentadecanylene ethylene), poly(4-butyl-5-perfluorohethoxy-10,12-pentacyclo[6.5.1.0$^{2,7}$.0$^{9,13}$.1$^{3,6}$]pentadecanylene ethylene), poly(4-hexyl-5-perfluorohethoxy-10,12-pentacyclo[6.5.1.0$^{2,7}$.0$^{9,13}$.1$^{3,6}$]pentadecanylene ethylene), poly(4-octyl-5-perfluorohethoxy-10,12-pentacyclo[6.5.1.0$^{2,7}$.0$^{9,13}$.1$^{3,6}$]pentadecanylene ethylene), poly(4-perfluoroheptoxy-10,12-pentacyclo[6.5.1.0$^{2,7}$.0$^{9,13}$.1$^{3,6}$]pentadecanylene ethylene), poly(4-perfluorooctoxy-10,12-pentacyclo[6.5.1.0$^{2,7}$.0$^{9,13}$.1$^{3,6}$]pentadecanylene ethylene), poly(4-perfluorodeoxy-10,12-pentacyclo[6.5.1.0$^{2,7}$.0$^{9,13}$.1$^{3,6}$]pentadecanylene ethylene), poly(4,4,5-trifluoro-perfluoropentoxy-10,12-pentacyclo[6.5.1.0$^{2,7}$.0$^{9,13}$.1$^{3,6}$]pentadecanylene ethylene), poly(4,5-difluoro-4-trifluoromethoxy-5-perfluorobutoxy-10,12-pentacyclo[6.5.1.0$^{2,7}$.0$^{9,13}$.1$^{3,6}$]pentadecanylene ethylene), poly(4,4,5-trifluoro-5-perfluorohethoxy-10,12-pentacyclo[6.5.1.0$^{2,7}$.0$^{9,13}$.1$^{3,6}$]pentadecanylene ethylene), poly(4,5-difluoro-4-trifluoromethoxy-5-perfluoropentyl-10,12-pentacyclo[6.5.1.0$^{2,7}$.0$^{9,13}$.1$^{3,6}$]pentadecanylene ethylene), poly(4,5-bis(perfluorobutoxy)-10,12-pentacyclo[6.5.1.0$^{2,7}$.0$^{9,13}$.1$^{3,6}$]pentadecanylene ethylene), poly(4,5-bis(perfluorohethoxy)-10,12-pentacyclo[6.5.1.0$^{2,7}$.0$^{9,13}$.1$^{3,6}$]pentadecanylene ethylene), poly(4-methoxy-5-trifluoromethoxy-10,12-pentacyclo[6.5.1.0$^{2,7}$.0$^{9,13}$.1$^{3,6}$]pentadecanylene ethylene), poly(4-tert-butoxymethyl-5-trifluoromethoxy-10,12-pentacyclo[6.5.1.0$^{2,7}$.0$^{9,13}$.1$^{3,6}$]pentadecanylene ethylene), poly(4-(2',2',2'-trifluoroethoxy)-10,12-pentacyclo[6.5.1.0$^{2,7}$.0$^{9,13}$.1$^{3,6}$]pentadecanylene ethylene), poly(4-(2',2',3',3',3'-pentafluoropropoxy)-10,12-pentacyclo[6.5.1.0$^{2,7}$.0$^{9,13}$.1$^{3,6}$]pentadecanylene ethylene), poly(4-methyl-5-(2',2',3',3',3'-pentafluoropropoxy)-10,12-pentacyclo[6.5.1.0$^{2,7}$.0$^{9,13}$.1$^{3,6}$]pentadecanylene ethylene), poly(4-butyl-5-(2',2',3',3',3'-pentafluoropropoxy)-10,12-pentacyclo[6.5.1.0$^{2,7}$.0$^{9,13}$.1$^{3,6}$]pentadecanylene ethylene), poly(4-(1',1',1'-trifluoro-iso-propoxy)-10,12-pentacyclo[6.5.1.0$^{2,7}$.0$^{9,13}$.1$^{3,6}$]pentadecanylene ethylene), poly(4-methyl-(1',1',1'-trifluoro-iso-propoxy)-10,12-pentacyclo[6.5.1.0$^{2,7}$.0$^{9,13}$.1$^{3,6}$]pentadecanylene ethylene), poly(4-(2',2',3',3',4',4',4'-heptafluorobutoxy)-10,12-pentacyclo[6.5.1.0$^{2,7}$.0$^{9,13}$.1$^{3,6}$]pentadecanylene ethylene), poly(4-(1',1',1'-trifluoro-iso-butoxy)-10,12-pentacyclo[6.5.1.0$^{2,7}$.0$^{9,13}$.1$^{3,6}$]pentadecanylene ethylene), poly(4-(1',1',1'-trifluoro-iso-butoxy)-10,12-pentacyclo[6.5.1.0$^{2,7}$.0$^{9,13}$.1$^{3,6}$]pentadecanylene ethylene), poly(4-methyl-5-(1',1',1'-trifluoro-iso-butoxy)-10,12-pentacyclo[6.5.1.0$^{2,7}$.0$^{9,13}$.1$^{3,6}$]pentadecanylene ethylene), poly(4-butyl-5-(1',1',1'-trifluoro-iso-butoxy)-10,12-pentacyclo[6.5.1.0$^{2,7}$.0$^{9,13}$.1$^{3,6}$]pentadecanylene ethylene), poly(4,5-difluoro-4-trifluoromethoxy-5-(2',2',2'-trifluoroethoxy)-10,12-pentacyclo[6.5.1.0$^{2,7}$.0$^{9,13}$.1$^{3,6}$]pentadecanylene ethylene), poly(4,4,5-trifluoro-5-(2',2',3',3',4',4',4'-heptafluorobutoxy)-10,12-pentacyclo[6.5.1.0$^{2,7}$.0$^{9,13}$.1$^{3,6}$]pentadecanylene ethylene), poly(4,5-difluoro-4-trifluoromethoxy-4-(2',2',3',3',4',4',4'-heptafluorobutoxy)-10,12-pentacyclo[6.5.1.0$^{2,7}$.0$^{9,13}$.1$^{3,6}$]pentadecanylene ethylene), poly(4-fluoro-4-(2',2',2'-trifluoroethoxy)-5,5-bis(trifluoromethoxy)-10,12-pentacyclo[6.5.1.0$^{2,7}$.0$^{9,13}$.1$^{3,6}$]pentadecanylene ethylene), poly(4,5-difluoro-4-(2',2',3',3',3'-pentafluoropropoxy)-5-trifluoromethoxy)-10,12-pentacyclo[6.5.1.0$^{2,7}$.0$^{9,13}$.1$^{3,6}$]pentadecanylene ethylene), poly(4-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4-methyl-5-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4-butyl-5-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4-hexyl-5-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4-octyl-5-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4-(2',2',3',3',4',4',5',5',6',6',7',7'-tridecafluoroheptoxy)-10,12-pentacyclo[6.5.1.0$^{2,7}$.0$^{9,13}$.1$^{3,6}$]pentadecanylene ethylene), poly(4-(2',2',3',3',4',4',5',5',6',6',7',7',8',8'-pentadecafluorooctoxy)-10,12-pentacyclo[6.5.1.0$^{2,7}$.0$^{9,13}$.1$^{3,6}$]pentadecanylene ethylene), poly(4-(2',2',3',3',4',4',5',5',6',6',7',7',8',8',9',9',9'-hepta decafluorodeoxy-10,12-pentacyclo[6.5.1.0$^{2,7}$.0$^{9,13}$.1$^{3,6}$]pentadecanylene ethylene), poly(4,4,5-trifluoro-5-(1',1',1')-trifluoro-iso-propoxy)-10,12-pentacyclo[6.5.1.0$^{2,7}$.0$^{9,13}$.1$^{3,6}$]pentadecanylene ethylene), poly(4,5-difluoro-4-trifluoromethoxy-5-(2',2',3',3',4',4',4'-heptafluorobutoxy)-10,12-pentacyclo[6.5.1.0$^{2,7}$.0$^{9,13}$.1$^{3,6}$]pentadecanylene ethylene), poly(4,4,5-trifluoro-(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), poly(4,5-Bis(2',2',3',3',4',4',4'-heptafluorobutoxy)-10,12-pentacyclo[6.5.1.0$^{2,7}$.0$^{9,13}$.1$^{3,6}$]pentadecanylene ethylene), poly(4,5-bis(2',2',3',3',4',4',5',5',6',6'-undecafluorohethoxy)-10,12-pentacyclo[6.5.1.0$^{2,7}$.0$^{9,13}$.1$^{3,6}$]pentadecanylene ethylene), and the like.

Among the above, as the fluorine-containing cyclic olefin polymer (A) according to the present embodiment, poly(1-fluoro-2-trifluoromethyl-3,5-cyclopentylene ethylene), poly(1-fluoro-1-trifluoromethyl-3,5-cyclopentylene ethylene), poly(1-methyl-1-fluoro-2-trifluoromethyl-3,5-cyclopentylene ethylene), poly(1,1-difluoro-2-trifluoromethyl-3,5-cyclopentylene ethylene), poly(1,2-difluoro-2-trifluoromethyl-3,5-cyclopentylene ethylene), poly(1-perfluoroethyl-3,5-cyclopentylene ethylene), poly(1,1-bis(trifluoromethyl)-3,5-cyclopentylene ethylene), poly(1,1,2-trifluoro-2-trifluoromethyl-3,5-cyclopentylene ethylene), poly(1,2-bis(trifluoromethyl)-3,5-cyclopentylene ethylene), poly(1-perfluoropropyl-3,5-cyclopentylene ethylene), poly(1-methyl-2-perfluoropropyl-3,5-cyclopentylene ethylene), poly(1-butyl-2-perfluoropropyl-3,5-cyclopentylene ethylene), poly(1-perfluoro-iso-propyl-3,5-cyclopentylene ethylene), poly(1-methyl-2-perfluoro-iso-propyl-3,5-cyclopentylene ethylene), poly(1,2-difluoro-1,2-bis(trifluoromethyl)-3,5-cyclopentylene ethylene), poly(1,1,2,2,3,3,3a,6a-octafluorocyclopentyl-4,6-cyclopentylene ethylene), poly(1,1,2,2,3,3,4,4,3a,7a-decafluorocyclohexyl-5,7-cyclopentylene ethylene), poly(1-perfluorobutyl-3,5-cyclopentylene ethylene), poly(1-perfluoro-iso-butyl-3,5-cyclopentylene ethylene), poly(1-perfluoro-tert-butyl-3,5-cyclopentylene ethylene), poly(1-methyl-2-perfluoro-iso-butyl-3,5-cyclopentylene ethylene), poly(1-butyl-2-perfluoro-iso)-butyl-3,5-cyclopentylene ethylene), poly(1,2-difluoro-1-trifluoromethyl-2-perfluoroethyl-3,5-cyclopentylene ethylene), poly(1-(1-trifluoromethyl-2,2,3,3,4,4,5,5-octafluoro-cyclopentyl)-3,5-cyclopentylene ethylene), poly((1,1,2-trifluoro-2-perfluorobutyl)-3,5-cyclopentylene ethylene), poly(1,2-difluoro-1-trifluoromethyl-2-perfluorobutyl-3,5-cyclopentylene ethylene), poly(1-fluoro-1-perfluoroethyl-2,2-bis(trifluoromethyl)-3,5-cyclopentylene ethylene), poly(1,2-difluoro-1-perfluoropropanyl-2-trifluoromethyl-3,5-cyclopentylene ethylene), poly(1-perfluorohexyl-3,5-cyclopentylene ethylene), poly(1-methyl-2-perfluorohexyl-3,5-cyclopentylene ethylene), poly(1-butyl-2-perfluorohexyl-3,5-cyclopentylene ethylene), poly(1-hexyl-2-perfluorohexyl-3,5-cyclopentylene ethylene), poly(1-octyl-2-perfluorohexyl-3,5-cyclopentylene ethylene), poly(1-perfluoroheptyl-3,5-cyclopentylene ethylene), poly(1-perfluorooctyl-3,5-cyclopentylene ethylene), poly(1-perfluorodecanyl-3,5-cyclopentylene ethylene), poly(1,1,2-trifluoro-perfluoropentyl-3,5-cyclopentylene ethylene), poly(1,2-difluoro-1-trifluoromethyl-2-perfluorobutyl-3,5-cyclopentylene ethylene), poly(1,1,2-trifluoro-perfluorohexyl-3,5-cyclopentylene ethylene), poly(1,2-difluoro-1-trifluoromethyl-2-perfluoropentyl-3,5-cyclopentylene ethylene), poly(1,2-bis(perfluorobutyl)-3,5-cyclopentylene ethylene), poly(1,2-bis(perfluorohexyl)-3,5-cyclopentylene ethylene), poly(1-methoxy-2-trifluoromethyl-3,5-cyclopentylene ethylene), poly(1-tert-butoxymethyl-2-trifluoromethyl-3,5-cyclopentylene ethylene), poly(1,1,3,3,3a, 6a-hexafluorofuranyl-3,5-cyclopentylene ethylene), and the like are preferable.

In addition, as long as the fluorine-containing cyclic olefin polymer (A) according to the present embodiment is in a range which does not impair the effect of the present embodiment, repeating structural units other than the repeating structural unit represented by General formula (1) may be included; however, the content of the repeating structural unit represented by General Formula (1) is usually 30 to 100% by mass when the entirety of the fluorine-containing cyclic olefin polymer (A) according to the present embodiment is 100% by mass, preferably 70 to 100% by mass, and more preferably 90 to 100% by mass.

The glass transition temperature of the fluorine-containing cyclic olefin polymer (A) according to the present embodiment as determined by differential scanning calorimetry is preferably 30 to 250° C., more preferably 50 to 200° C., and even more preferably 60 to 160° C. When the glass transition temperature is the lower limit value described above or more, it is possible to maintain the fine uneven pattern shape formed after peeling from the mold with high precision. In addition, when the glass transition temperature is the upper limit value described above or less, it is possible to lower the heating process temperature in order that melting and flowing easily occur and to suppress yellowing of the resin layer or deterioration of the support.

In the fluorine-containing cyclic olefin polymer (A) according to the present embodiment, for example, the weight average molecular weight (Mw) in terms of polystyrene measured by gel permeation chromatography (GPC) at a sample concentration of 3.0 to 9.0 mg/ml is preferably 5,000 to 1,000,000, and more preferably 10,000 to 300,000. When the weight average molecular weight (Mw) is in the range described above, the solvent solubility and the flowability at the time of thermocompression molding of the fluorine-containing cyclic olefin polymer (A) are favorable.

In addition, in order to form a resin layer having a uniform thickness or to obtain favorable heat formability, the molecular weight distribution of the fluorine-containing cyclic olefin polymer (A) is preferably wide. Thus, the molecular weight distribution (Mw/Mn), which is the ratio of the weight average molecular weight (Mw) to the number average molecular weight (Mn), is preferably 1.0 to 5.0, more preferably 1.2 to 5.0, and even more preferably 1.4 to 3.0.

It is possible to produce the fluorine-containing cyclic olefin polymer (A) according to the present embodiment by, for example, polymerizing a fluorine-containing cyclic olefin monomer represented by General Formula (2) using a ring-opening metathesis polymerization catalyst, and hydrogenating the olefin part of the main chain of the obtained polymer. More specifically, it is possible to produce the fluorine-containing cyclic olefin polymer (A) according to the present embodiment, for example, according to the method described in paragraphs 0075 to 0099 of WO 2011/024421 A1.

[Chem. 3]

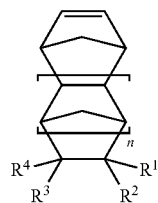

(2)

In General Formula (2), $R^1$ to $R^4$ and n are as defined in General Formula (1).

In addition, as a monomer used of producing the fluorine-containing cyclic olefin polymer (A) according to the present embodiment, one or more of the fluorine-containing cyclic olefin monomer represented by General Formula (2) may be used.

In addition, the hydrogenation ratio of the olefin part of the fluorine-containing cyclic olefin polymer (A) according to the present embodiment is preferably 50 mol % or more, more preferably 70 mol % or more and 100 mol % or less, and even more preferably 90 mol % or more and 100 mol % or less. When the hydrogenation ratio is the lower limit value described above or more, it is possible to suppress oxidation of the olefin part and deterioration due to light absorption and to further improve the heat resistance or weather resistance.

Furthermore, when photocuring the photocurable compound (B) of the present embodiment, it is possible to perform the light transmission more uniformly from the air surface to the interface with the substrate and to cure the photocurable compound (B) more uniformly without unevenness in the photocuring.

<Photocurable Compound (B)>

Examples of the photocurable compound (B) include a compound having a reactive double bond group, a ring-opening polymerizable compound capable of cationic polymerization, and the like, and a ring-opening polymerizable compound capable of cationic polymerization is preferable. These compounds may have one or a plurality of reactive groups in one molecule, but a compound having two or more reactive groups is preferably used.

In addition, compounds having different numbers of reactive groups may be mixed and used at an arbitrary ratio, and a compound having a reactive double bond group and a ring-opening polymerizable compound capable of cationic polymerization may be mixed and used at an arbitrary ratio.

Due to these, it is possible to efficiently form a three-dimensional network structure in the interior and on the surface of the obtained resin layer, and, as a result, it is possible to obtain a resin layer having high surface hardness. In addition, it is also possible to adjust the etching property in an etching process to the characteristics according to the processing substrate by selecting the type and composition ratio of the photocurable compound (B).

Among photocurable compounds (B), examples of compounds which have a reactive double bond group include olefins such as fluorodiene ($CF_2$=$CFOCF_2CF_2CF$=$CF_2$, $CF_2$=$CFOCF_2CF(CF_3)$ $CF$=$CF_2$, $CF_2$=$CFCF_2C(OH)(CF_3)CH_2CH$=$CH_2$, $CF_2$=$CFCF_2C(OH)(CF_3)CH$=$CH_2$, $CF_2$=$CFCF_2C(CF_3)(OCH_2OCH_3)CH_2CH$=$CH_2$, $CF_2$=$CFCH_2C(C(CF_3)_2OH)(CF_3)CH_2CH$=$CH_2$ and the like); cyclic olefins such as norbornene and norbornadiene; alkyl vinyl ethers such as cyclohexylmethyl vinyl ether, isobutyl vinyl ether, cyclohexyl vinyl ether, and ethyl vinyl ether; vinyl esters such as vinyl acetate; (meth)acrylates and derivatives thereof such as (meth)acrylic acid, phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, 4-hydroxybutyl vinyl ether, N,N-diethylaminoethyl acrylate, N,N-dimethylaminoethyl acrylate, N-vinyl pyrrolidone, and dimethylaminoethyl methacrylate, or fluorine-containing acrylates thereof and the like.

More preferable examples include a trifunctional or higher functional acrylate as represented by General Formula (5), (6), (7) or (8). These may be used alone or in a combination of two or more.

Using a (meth)acrylate monomer having a reactive double bond group which is trifunctional or higher makes it possible to efficiently form a three-dimensional network structure after light irradiation curing.

[Chem. 4]

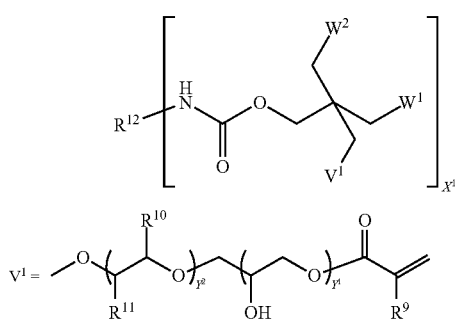

(5)

In General Formula (5), $R^{12}$ represents toluylene, diphenylmethane, hexamethylene, norbornane dimethylene, dicyclohexylene methane, trimethylcyclohexylene, cyclohexane dimethylene, N,N',N"-tris(hexamethylene)-isocyanurate, N,N'-dihexamethylene-urea, N,N,N'-tris(hexamethylene)-urea, N,N,N'N'-tetrakis(hexamethylene)-urea, or xylylene. $R^9$, $R^{10}$ and $R^{11}$ each independently represent H or $CH_3$. $W^1$ and $W^2$ each independently represent H, $CH_3$, OH, or $V^1$. $X^1$ represents an integer of 2 to 4. $Y^1$ is an integer of 0 to 2 and $Y^2$ is an integer of 0 to 5.

[Chem. 5]

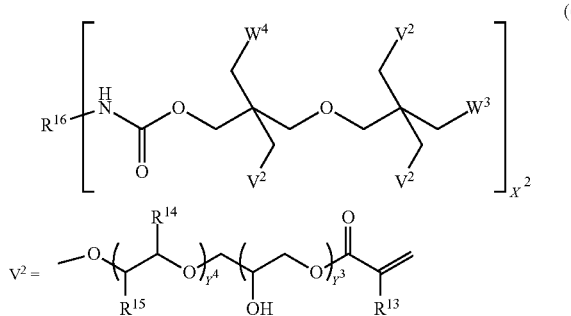

(6)

In General Formula (6), $R^{16}$ represents toluylene, diphenylmethane, hexamethylene, norbornane dimethylene, dicyclohexylene methane, trimethylcyclohexylene, cyclohexane dimethylene, N,N',N"-tris(hexamethylene)-isocyanurate, N,N'-dihexamethylene-urea, N,N,N'-tris(hexamethylene)-urea, N,N,N'N'-tetrakis(hexamethylene)-urea, or xylylene. $R^{13}$, $R^{14}$ and $R^{15}$ each independently represent H or $CH_3$. $W^3$ and $W^4$ each independently represent H, $CH_3$, OH, or $V^2$. $X^2$ represents an integer of 2 to 4. $Y^3$ represents an integer of 0 to 2 and $Y^4$ represents an integer of 0 to 5.

[Chem. 6]

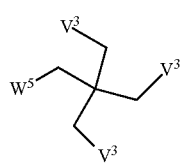

(7)

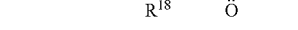

In General Formula (7), $W^5$ represents H, $CH_3$, OH, or $V^3$. $R^{17}$, $R^{18}$, and $R^{19}$ each independently represent H or $CH_3$ and $Y^5$ represents an integer of 0 to 20.

[Chem. 7]

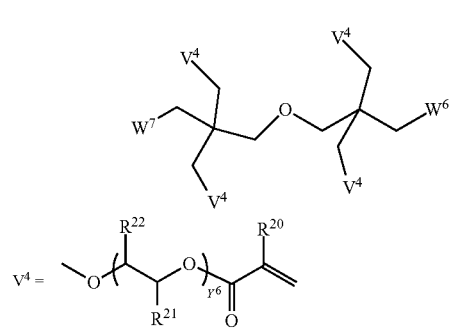

(8)

In General Formula (8), $W^6$ and $W^7$ each independently represent H, $CH_3$, OH, or $V^4$. $R^{20}$, $R^{21}$, and $R^{22}$ each independently represent H or $CH_3$ and $Y^6$ represents an integer of 0 to 3.

In addition, among the photocurable compounds (B), examples of a ring-opening polymerizable compound capable of cationic polymerization include epoxy compounds such as epoxy compounds such as alicyclic epoxy resins such as 1,7-octadiene diepoxide, 1-epoxydecane, cyclohexene epoxide, dicyclopentadiene oxide, limonene dione oxide, 4-vinylcyclohexene dioxide, 3,4-epoxycyclohexylmethyl-3',4'-epoxycyclohexanecarboxylate, di (3,4-epoxycyclohexyl) adipate, (3,4-epoxycyclohexyl) methyl alcohol, (3,4-epoxy-6-methylcyclohexyl) methyl-3,4-epoxy-6-methylcyclohexanecarboxylate, ethylene 1,2-di (3,4-epoxycyclohexanecarboxylic acid) ester, (3,4-epoxycyclohexyl) ethyltrimethoxysilane, phenyl glycidyl ether, dicyclohexyl-3,3'-diepoxide, 3',4'-epoxycyclohexylethyl methyl-3,4-epoxycyclohexanecarboxylate, limonene dioxide, cyclohexene oxide, α-pinene oxide, bis(3,4-epoxycyclohexylmethyl) adipate, bisphenol A epoxy resin, halogenated bisphenol A epoxy resin, bisphenol F epoxy resin, o-, m-, p-cresol novolac epoxy resin, phenol novolac epoxy resin, polyglycidyl ether of a polyhydric alcohol, 3,4-epoxycyclohexenylmethyl-3',4'-epoxycyclohexene carboxylate, or glycidyl ether of hydrogenated bisphenol A; oxetane compounds such as, as a compound having one oxetanyl group, 3-methyl-3-(butoxymethyl)oxetane, 3-methyl-3-(pentyloxymethyl)oxetane, 3-methyl-3-(hexyloxymethyl) oxetane, 3-methyl-3-(2-ethylhexyloxymethyl)oxetane, 3-methyl-3-(octyloxymethyl)oxetane, 3-methyl-3-(decanoloxymethyl)oxetane, 3-methyl-3-(dodecanoroxymethyl)oxetane, 3-methyl-3-(phenoxymethyl) oxetane, 3-ethyl-3-(butoxymethyl)oxetane, 3-ethyl-3-(pentyloxymethyl)oxetane, 3-ethyl-3-(hexyloxymethyl)oxetane, 3-ethyl-3-(2-ethylhexyloxymethyl)oxetane, 3-ethyl-3-(octyloxymethyl) oxetane, 3-ethyl-3-(decanoloxymethyl)oxetane, 3-ethyl-3-(dodecanoroxymethyl)oxetane, 3-(cyclohexyloxymethyl)oxetane, 3-methyl-3-(cyclohexyloxymethyl)

oxetane, 3-ethyl-3-(cyclohexyloxymethyl) oxetane, 3-ethyl-3-(phenoxymethyl)oxetane, 3,3-dimethyloxetane, 3-hydroxymethyloxetane, 3-methyl-3-hydroxymethyloxetane, 3-ethyl-3-hydroxymethyloxetane, 3-ethyl-3-phenoxymethyloxetane, 3-n-propyl-3-hydroxymethyloxetane, 3-isopropyl-3-hydroxymethyloxetane, 3-n-butyl-3-hydroxymethyloxetane, 3-isobutyl-3-hydroxymethyloxetane, 3-sec-butyl-3-hydroxymethyloxetane, 3-tert-butyl-3-hydroxymethyloxetane, 3-ethyl-3-(2-ethylhexyl)oxetane, and the like, and, as a compound having two or more oxetanyl groups, bis[(3-ethyl-3-oxetanylmethyl) ether, 1,2-bis[(3-ethyl-3-oxetanylmethoxy)]ethane, 1,3-bis[(3-ethyl-3-oxetanylmethoxy)]propane, 1,3-bis[(3-ethyl-3-oxetanylmethoxy)]-2,2-dimethyl-propane, 1,4-bis(3-ethyl-3-oxetanylmethoxy) butane, 1,6-bis(3-ethyl-3-oxetanylmethoxy) hexane, 1,4-bis[(3-methyl-3-oxetanyl) methoxy]benzene, 1,3-bis[(3-methyl-3-oxetanyl) methoxy]benzene, 1,4-bis {[(3-methyl-3-oxetanyl) methoxy]methyl}benzene, 1,4-bis {[(3-methyl-3-oxetanyl) methoxy]methyl}cyclohexane, 4,4'-bis {[(3-methyl-3-oxetanyl) methoxy]methyl}biphenyl, 4,4'-bis {[(3-methyl-3-oxetanyl) methoxy]methyl}bicyclohexane, 2,3-bis[(3-methyl-3-oxetanyl) methoxy]bicyclo[2.2.1]heptane, 2,5-bis[(3-methyl-3-oxetanyl) methoxy]bicyclo[2.2.1]heptane, 2,6-bis [(3-methyl-3-oxetanyl) methoxy]bicyclo[2.2.1]heptane, 1,4-bis[(3-ethyl-3-oxetanyl) methoxy]benzene, 1,3-bis[(3-ethyl-3-oxetanyl) methoxy]benzene, 1,4-bis {[(3-ethyl-3-oxetanyl) methoxy]methyl}benzene, 1,4-bis {[(3-ethyl-3-oxetanyl) methoxy]methyl}cyclohexane, 4,4'-bis {[(3-ethyl-3-oxetanyl) methoxy]methyl}biphenyl, 4,4'-bis {[(3-ethyl-3-oxetanyl) methoxy]methyl}bicyclohexane, 2,3-bis[(3-ethyl-3-oxetanyl) methoxy]bicyclo[2.2.1]heptane, 2,5-bis [(3-ethyl-3-oxetanyl) methoxy]bicyclo[2.2.1]heptane, and 2,6-bis[(3-ethyl-3-oxetanyl) methoxy]bicyclo[2.2.1]heptane. In addition, various forms of fluorine-based epoxy compounds and fluorine-based oxetane compounds in which the carbon-hydrogen bonds in the above-described photocurable compound (B) are substituted with carbon-fluorine bonds may be used.

In addition, these photocurable compounds (B) may be used alone or in a combination of two or more.

Examples of the ring-opening polymerizable compound capable of cationic polymerization include trifunctional or higher functional epoxy compounds as represented by General Formula (9). The above may be used alone or in a combination of two or more. Using an epoxy monomer having a trifunctional or higher epoxy group makes it possible to efficiently form a three-dimensional network structure after light irradiation curing.

[Chem. 8]

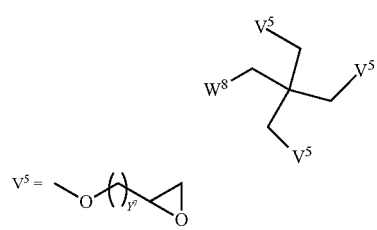

(9)

In General Formula (9), $W^8$ represents H, an alkyl group having 1 to 3 carbon atoms, OH, or $V^5$, and $Y^7$ represents an integer of 1 to 20.

In the resin composition (P) according to the present embodiment, the mass ratio ((A)/(B)) of the content of the fluorine-containing cyclic olefin polymer (A) to the content of the photocurable compound (B) in the resin composition (P) is preferably 1/99 or more and 99/1 or less, more preferably 1/99 or more and 95/5 or less, and even more preferably 5/95 or more and 95/5 or less.

In addition, for example, in a case of using the ink jet method described below in particular, (A)/(B) is preferably in a range of 1/99 or more and 80/20 or less, and more preferably in a range of 1/99 or more and 70/30 or less.

<Photocuring Initiator (C)>

Examples of the photocuring initiator (C) include photo radical initiators which generate radicals by being irradiated with light, photo cation initiators which generate cations by being irradiated with light, and the like. The use amount of the photocuring initiator (C) is preferably 0.05 parts by mass or more with respect to 100 parts by mass of the photocurable compound (B), and more preferably 0.1 to 10 parts by mass.

Among the photocuring initiators (C), examples of photo radical initiators which generate radicals by being irradiated with light include acetophenones such as acetophenone, p-tert-butyltrichloroacetophenone, chloroacetophenone, 2,2-diethoxyacetophenone, hydroxyacetophenone, 2,2-dimethoxy-2'-phenylacetophenone, 2-aminoacetophenone, and dialkylaminoacetophenone; benzoins such as benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropane-1-one, and 1-(4-isopropylphenyl)-2-hydroxy-2-methylpropane-1-one; benzophenones such as benzophenone, benzoylbenzoic acid, methyl benzoylbenzoate, methyl-o-benzoylbenzoate, 4-phenylbenzophenone, hydroxybenzophenone, hydroxypropylbenzophenone, acrylic benzophenone, and 4,4'-bis(dimethylamino) benzophenone; thioxanthones such as thioxanthone, 2-chlorothioxanthone, 2-methylthioxanthone, diethylthioxanthone, and dimethylthioxanthone; fluorinated peroxides such as perfluoro (tert-butylperoxide) and perfluorobenzoyl peroxide; α-acyloxime ester, benzyl (o-ethoxycarbonyl)-α-monoxime, acyl phosphine oxide, glyoxy ester, 3-ketocoumarin, 2-ethyl anthraquinone, camphorquinone, tetramethylthiuram sulfide, azobisisobutyronitrile, benzoyl peroxide, dialkyl peroxide, tert-butyl peroxypivalate, and the like.

More preferable examples of the photo radical initiator to be used include Irgacure 290 (produced by Ciba Specialty Chemicals), Irgacure 651 (produced by Ciba Specialty Chemicals), Irgacure 184 (produced by Ciba Specialty Chemicals), Darocure 1173 (produced by Ciba Specialty Chemicals), benzophenone, 4-phenylbenzophenone, Irgacure 500 (produced by Ciba Specialty Chemicals), Irgacure 2959 (produced by Ciba Specialty Chemicals), Irgacure 127 (produced by Ciba Specialty Chemicals), Irgacure 907 (produced by Ciba Specialty Chemicals), Irgacure 369 (produced by Ciba Specialty Chemicals), Irgacure 1300 (produced by Ciba Specialty Chemicals), Irgacure 819 (produced by Ciba Specialty Chemicals), Irgacure 1800 (produced by Ciba Specialty Chemicals), Darocure TPO (produced by Ciba Specialty Chemicals), Darocure 4265 (produced by Ciba Specialty Chemicals), Irgacure OXEO1 (produced by Ciba Specialty Chemicals), Irgacure OXE02 (produced by Ciba Specialty Chemicals), Esacure KT55 (produced by Lamberti), Esacure KIP150 (produced by Lamberti), Esacure KIP 100 F (produced by Lamberti), Esacure KT 37 (produced by Lamberti), Esacure KTO 46 (produced by Lamberti), Esacure 1001 M (produced by Lamberti), Esacure KIP/EM (produced by Lamberti), Esacure DP250 (produced by Lamberti), Esacure KB1 (produced by Lamberti), 2,4-diethylthioxanthone, and the like. Among these, examples of even more preferably used photo radical polymerization initiators include Irgacure 290 (produced by Ciba Specialty Chemicals), Irgacure 184 (produced by Ciba Specialty Chemicals), Darocure 1173 (produced by Ciba Specialty Chemicals), Irgacure 500 (produced by Ciba Specialty Chemicals), Irgacure 819 (produced by Ciba Specialty Chemicals), Darocure TPO (produced by Ciba Specialty Chemicals), Esacure KIP100F (produced by Lamberti), Esacure KT37 (produced by Lamberti), and Esacure KT046 (produced by Lamberti). In addition, these photo radical initiators may be used alone or in a combination of two or more.

Among the photocuring initiators (C), as long as the photo cation initiator which generates cations by being irradiated with light is a compound which initiates cationic polymerization of the ring-opening polymerizable compounds capable of cationic polymerization by light irradiation, there is no particular limitation; however, for example, a compound which photo-reacts to release a Lewis acid such as an onium salt of an onium cation and an anion forming a pair with the onium cation is preferable.

Examples of onium cations include diphenyliodonium, 4-methoxydiphenyliodonium, bis(4-methylphenyl) iodonium, bis(4-tert-butylphenyl) iodonium, bis(dodecylphenyl) iodonium, triphenylsulfonium, diphenyl-4-thiophenoxyphenylsulfonium, bis[4-(diphenylsulfonio)-phenyl]sulfide, bis[4-(di (4-(2-hydroxyethyl) phenyl) sulfonio)-phenyl]sulfide, η5-2,4-(cyclopentadienyl) [1,2,3,4,5, 6-η-(methylethyl) benzene]-iron (1+) and the like. In addition, other than the onium cation, examples thereof include perchlorate ions, trifluoromethanesulfonate ions, toluenesulfonate ions, trinitrotoluenesulfonate ions, and the like. In addition, these photo cation initiators may be used alone or in a combination of two or more.

On the other hand, examples of the anions include tetrafluoroborate, hexafluorophosphate, hexafluoroantimonate, hexafluoroarsenate, hexachloroantimonate, tetra(fluorophenyl)borate, tetra(difluorophenyl)borate, tetra(trifluorophenyl)borate, tetra(tetrafluorophenyl)borate, tetra(pentafluorophenyl)borate, tetra(perfluorophenyl)borate, tetra (trifluoromethylphenyl)borate, tetra(di (trifluoromethyl) phenyl)borate, and the like. In addition, these photo cation initiators may be used alone or in a combination of two or more.

Specific examples of more preferably used photo cation initiators include Irgacure 250 (produced by Ciba Specialty Chemicals), Irgacure 784 (produced by Ciba Specialty Chemicals), Esacure 1064 (produced by Lamberti), CYRAURE UVI 6990 (produced by Union Carbite Japan), Adeka Optomer SP-172 (produced by Adeka Corp.), Adeka Optomer SP-170 (produced by Adeka Corp.), Adeka Optomer SP-152 (produced by Adeka Corp.), Adeka Optomer SP-150 (produced by Adeka Corp.), CPI-210S (produced by San-Apro Ltd.), CPI-200K (produced by San-Apro Ltd.), CPI-310B (produced by San-Apro Ltd.), CPI-100P (produced by San-Apro Ltd.), and the like. In addition, these photo cation initiators may be used alone or in a combination of two or more.

It is possible to use the photocurable compound (B) and the photocuring initiator (C) as a photocurable composition containing the above. The photocurable composition may be obtained, for example, by dissolving the photocuring initiator (C) in the photocurable compound (B) described above, or the photocurable compound (B) and the photocuring initiator (C) may be dissolved together in an organic solvent. Furthermore, as necessary, as a third component, other known components may be included, for example, modifiers such as antiaging agents, leveling agents, wettability improvers, surfactants, and plasticizers, stabilizers such as ultraviolet absorbers, preservatives, and antibacterial agents, photosensitizers, silane coupling agents, and the like.

The organic solvent used to prepare the photocurable composition is not particularly limited and examples thereof include fluorine-containing aromatic hydrocarbons such as metaxylene hexafluoride, benzotrifluoride, fluorobenzene, difluorobenzene, hexafluorobenzene, trifluoromethylbenzene, bis(trifluoromethyl) benzene, and metaxylene hexafluoride; fluorine-containing aliphatic hydrocarbons such as perfluorohexane and perfluorooctane; fluorine-containing aliphatic cyclic hydrocarbons such as perfluorocyclodecaline; fluorine-containing ethers such as perfluoro-2-butyltetrahydrofuran; halogenated hydrocarbons such as chloroform, chlorobenzene, and trichlorobenzene; ethers such as tetrahydrofuran, dibutyl ether, 1,2-dimethoxyethane, dioxane, propylene glycol monomethyl ether, dipropylene glycol monomethyl ether, propylene glycol monomethyl ether acetate, propylene glycol diacetate, 3-methoxybutyl acetate, cyclohexanol acetate, dipropylene glycol dimethyl ether, dipropylene glycol methyl-n-propyl ether, dipropylene glycol methyl ether acetate, 1,4-butanediol acetate, 1,3-butylene glycol diacetate, 1,6-hexanediol diacetate, ethylene glycol monomethyl ether acetate, propylene glycol monomethyl ether acetate, ethylene glycol monobutyl ether acetate, diethylene glycol monoethyl ether acetate, diethylene glycol monobutyl ether acetate and triacetin; esters such as ethyl acetate, propyl acetate, and butyl acetate; ketones such as methyl ethyl ketone, methyl isobutyl ketone, and cyclohexanone; alcohols such as methanol, ethanol, isopropyl alcohol, 2-methoxyethanol, 3-methoxypropanol, propylene glycol monomethyl ether, 3-methoxybutanol, 1,3-butylene glycol, propylene glycol-n-propyl ether, propylene glycol-n-butyl ether, dipropylene glycol methyl ether, diethylene glycol monoethyl ether, dipropylene glycol n-propyl ether, dipropylene glycol-n-butyl ether, tripropylene glycol methyl ether, tripropylene glycol-n-butyl ether, and the like. It is possible to select from among the above in consideration of solubility and the film forming property and the organic solvent may be the same or different from the organic solvent which dissolves the fluorine-containing cyclic olefin polymer (A).

In a case where the resin composition (P) according to the present embodiment includes the fluorine-containing cyclic olefin polymer (A) including a repeating structural unit represented by General Formula (1), the photocurable compound (B) and the photocuring initiator (C), a specific fluorine-containing cyclic olefin polymer (A) having a hydrocarbon structure in the main chain and a fluorine-containing aliphatic ring structure in the side chain is used, thus, it is possible to form intermolecular or intramolecular hydrogen bonds. Furthermore, since the photocurable compound (B) and the photocuring initiator (C) are used, it is possible to form a three-dimensional network structure in the interior and on the surface of the resin layer, after being irradiated with light for curing. These actions make it possible to suppress dimensional changes in the resin layer in the process of heating, cooling, and light irradiation curing in the producing steps of the first resin layer 103 in which the first fine uneven pattern 102 is formed on the surface and to improve the hardness of the resin layer. In addition, it is also possible to adjust the etching property in an etching process to the characteristics according to the processing substrate by selecting the type and composition ratio of the photocurable compound (B).

In a case where the resin composition (P) according to the present embodiment is varnish-like and includes an organic solvent, the solid content concentration of the resin composition (P) {mass (%)=mass of solid component/(mass of solid component+mass of organic solvent)×100} is preferably 1% by mass or more and 99% by mass or less, more preferably 1% by mass or more and 80% by mass or less, and even more preferably 1% by mass or more and 70% by mass or less, and is suitably selected depending on the coating method, the desired film thickness, and the like.

Here, the solid component is a component other than the organic solvent, for example, the fluorine-containing cyclic olefin polymer (A), the photocurable compound (B), the photocuring initiator (C), other additives, and the like.

Adjusting the solid content concentration of the resin composition (P) in the above range makes it possible to make the in-plane film thickness uniformity at the time of coating film formation good and to produce a coating film having a desired film thickness. In addition, in a case where the photocurable compound (B) dissolves the fluorine-containing cyclic olefin polymer (A) and it is possible to form a favorable coating film with a desired coating method and film thickness, it is not necessarily required to use an organic solvent.

<Method for Preparing Resin Composition (P)>

It is possible to obtain the resin composition (P) according to the present embodiment by, for example, preparing a fluorine-containing cyclic olefin polymer (A) in advance in a solution of an arbitrary concentration, adding the photocurable composition to the obtained solution, and uniformly mixing the solution.

In addition, it is possible to substitute the liquid photocurable compound (B) as a solvent and to prepare the resin composition (P) without using an organic solvent.

The organic solvent used in preparing the resin composition (P) may be the same as the organic solvent used when preparing the photocurable composition described above, and is not particularly limited.

In addition, in the same manner as the photocurable composition described above, the resin composition (P) may include, as necessary, as a third component, other known components, for example, modifiers such as antiaging agents, leveling agents, wettability improvers, surfactants, and plasticizers, stabilizers such as ultraviolet absorbers, preservatives, and antibacterial agents, photosensitizers, silane coupling agents, and the like.

2. Method of Producing Substrate with Fine Uneven Pattern

Next, a description about each step of the producing method for the substrate 101a with a fine uneven pattern according to the present embodiment will be given.

(Step (a))

First, as shown in FIG. 1 (a), the laminate 100 is prepared which is provided with the substrate 101, and a first resin layer 103 provided on the substrate 101 and having a first fine uneven pattern 102 formed on the surface thereof.

It is possible to produce the laminate 100 by, for example, as shown in FIG. 2, a step (a1) of pressing a mold 108 having a third fine uneven pattern 107 on the first resin layer 106 which is provided on the substrate 101 and which includes the fluorine-containing cyclic olefin polymer (A). By doing so, a first fine uneven pattern 102 corresponding to the third fine uneven pattern 107 is formed on the surface of the first resin layer 106, and obtaining the first resin layer 103 on which the first fine uneven pattern 102 is formed.

A description about the step (a1) will be given below.

The substrate 101 is not particularly limited and, for example, it is possible to use a quartz substrate, a silicon substrate, a nickel substrate, an aluminum substrate, a sapphire substrate, or the like.

In addition, the shape of the substrate 101 is also not particularly limited, and examples thereof include a plate shape, a disk shape, a roll shape, and the like.

Examples of a method for forming the first resin layer 106 provided on the substrate 101 and including the fluorine-containing cyclic olefin polymer (A) include a method for forming the first resin layer 106 by coating the resin composition (P) over the substrate 101 using a method such as a table coating method, a spin coating method, a dip coating method, a die coating method, a spray coating method, a bar coating method, a roll coating method, a curtain flow coating method, a slit coating method, or an ink jet coating method.

The method for forming the first resin layer 106 may be selected appropriately from the above in consideration of the shape of the substrate, the thickness of the first resin layer 106, the productivity, and the like.

Among the above, in particular, a description about ink jet coating, which is the latest coating method which has recently begun to spread in the industry in the field of thin film coating, will be given.

Conventionally, in the field of thin film coating, in particular, in a case where the film thickness is less than 1 µm, a coating method using spin coating is widely used in the fields of semiconductors, displays, circuit formation, and the like. However, in this method, since the coating film is formed by the circular motion of the substrate, for example, when coating on a rectangular substrate such as a rectangle or a square, there is a problem in that the in-plane uniformity of the film thickness is poor, such as liquid having a raised shape at the corners, and the utilization rate of the coating liquid is extremely poor. On the other hand, ink jet coating, which has recently begun to spread widely focusing on the field of displays and circuit formation, in particular, in thin film coating where the film thickness is less than 1 µm, forming a uniform coating film is possible and increasing the area is easy, and application to a wide range of fields as a new method for thin film coating is beginning due to the advantages such as the high utilization rate of the coating liquid.

Ink jet coating is a coating method using a method of directly discharging ink ('ink' means coating liquid) to form a film or a circuit on a substrate, in which intermittent operation is possible and it is in principle possible to use the coating liquid with a use efficiency close to 100%. In addition, since the coating liquid is usually discharged from a head in which approximately several pins to 1000 pins are arranged in a group, it is possible to easily carry out coating according to the substrate area from a small area to a large area simply by arranging the heads in the vertical and horizontal directions.

An important point in the implementation of the ink jet coating is discharging droplets which are uniform in size (also called particles) from one pin. In the piezo method widely applied in liquid discharging methods, a voltage is applied to a piezo element arranged in a microtube holding several pL to several 10 pL of coating liquid to deform the piezoelectric element and discharge droplets in a certain quantity. At this time, discharging the liquid droplets in a uniformed shape in which the particles are uniformed makes it possible to form a coating film with high film thickness precision.

The surface tension (mN/m) and the viscosity (mPas) are applied as the indices required for the coating liquid when making discharge possible in a state in which the particles are uniformed. In particular, the surface tension is the most important parameter and using a coating liquid (resin composition (P)) adjusted to a range of preferably 10 mN/m to 60 mN/m, more preferably 20 mN/m to 50 mN/m, and even more preferably 25 mN/m to 45 mN/m, and using a coating liquid (resin composition (P)) in which the viscosity (mPas) of the coating liquid (resin composition (P)) is adjusted to a range of preferably 1 mPas to 30 mPas, more preferably 1 mPas to 20 mPas, and even more preferably 1 mPas to 15 mPas, tends to make it possible to keep the shape of the discharged liquid droplets close to a spherical shape. In a case where the surface tension (mN/m) and the viscosity (mPas) are in the above ranges, it is possible to discharge the liquid droplets more favorably and to suppress thread-tailing during discharging, the discharged liquid droplets from breaking and flying in a non-uniform manner, or the like, such that the in-plane uniformity of the film thickness is easily improved.

For the purpose of adjusting the surface tension and viscosity, various types of leveling agents and solvents and a photocurable compound may be added to the resin composition (P) according to the present embodiment in a range in which the effects of the present invention are not impaired. Two or more of these may be used in combination. Among the above solvents, the same solvent as the organic solvents used for preparing the photocurable composition described above may be used; however, it is preferable to use a solvent having a boiling point of 140° C. or higher at atmospheric pressure such as propylene glycol monomethyl ether, dipropylene glycol monomethyl ether, propylene glycol monomethyl ether acetate, propylene glycol diacetate, 3-methoxybutyl acetate, cyclohexanol acetate, dipropylene glycol dimethyl ether, dipropylene glycol methyl-n-propyl ether, dipropylene glycol methyl ether acetate, 1,4-butanediol acetate, 1,3-butylene glycol diacetate, 1,6-hexanediol diacetate, ethylene glycol monomethyl ether acetate, propylene glycol monomethyl ether acetate, ethylene glycol monobutyl ether acetate, diethylene glycol monoethyl ether acetate, diethylene glycol monobutyl ether acetate, or triacetin. Due to this, while adjusting the surface tension of the coating liquid in the range described above, evaporation of the coating liquid is prevented such that the in-plane uniformity of the film thickness is increased, which tends to be advantageous for various applications specific to the ink jet coaters such as in intermittent operation.

The shape of the protrusions and the recesses of the mold 108 having the third fine uneven pattern 107 is not particularly limited and examples thereof include dome shapes, square columns, columnar shapes, prisms, square pyramids, triangular pyramids, polyhedrons, hemispheres, and the like. In addition, the cross-sectional shapes of the protrusion and the recess are not particularly limited and examples thereof include cross-section squares, cross-section triangles, cross-section semi-circles, and the like.

The width of the protrusion and/or recess of the first fine uneven pattern 102 and the third fine uneven pattern 107 is not particularly limited and is, for example, 10 nm to 50 μm, and preferably 20 nm to 10 μm. In addition, the depth of the recess and/or the height of the protrusion is not particularly limited, but is, for example, 10 nm to 50 μm, and preferably 50 nm to 10 μm. Furthermore, the aspect ratio of the ratio of the width of the protrusion to the height of the protrusion is preferably 0.1 to 500, and more preferably 0.5 to 20.

Examples of the material of the mold 108 having the third fine uneven pattern 107 include metal materials such as nickel, iron, stainless steel, germanium, titanium, and silicon; inorganic materials such as glass, quartz, and alumina; resin materials such as polyimide, polyamide, polyester, polycarbonate, polyphenylene ether, polyphenylene sulfide, polyacrylate, polymethacrylate, polyarylate, epoxy resin, and silicone resin; carbon materials such as diamond and graphite, and the like.

The method for pressing the mold 108 having the third fine uneven pattern 107 to the first resin layer 106 provided on the substrate 101 and including the fluorine-containing cyclic olefin polymer (A) is not particularly limited and examples thereof include a method for pressing the surface of the first resin layer 106 with a surface of the mold 108 on which the third fine uneven pattern 107 is formed.

The pressure at the time of pressing the mold 108 is not particularly limited, but, for example, 10 MPa or less is preferable, 5 MPa or less is more preferable, and 1 MPa or less is particularly preferable. The pressure at the time of pressing the mold 108 is appropriately selected depending on the desired pattern shape and aspect ratio of the mold 108 and the material of the mold 108.

By pressing the mold 108 onto the first resin layer 106 provided on the substrate 101 and including the fluorine-containing cyclic olefin polymer (A), the first resin layer 106 positioned at the protrusion of the mold 108 is pushed to the side of the recess of the mold 108 and the third fine uneven pattern 107 of the mold 108 is transferred to the surface of the first resin layer 106.

It is possible to form the third fine uneven pattern 107 of the mold 108, for example, by a photolithographic method, an electron beam lithographic method, or the like. Alternatively, depending on the form of use, the film or sheet on which the uneven structure obtained using the resin composition (P) according to the present embodiment is formed may be used as the mold 108.

Here, in a case where the resin composition (P) further includes the photocurable compound (B) and the photocuring initiator (C), as shown in FIG. 3, it is possible to further include the step (a2) of forming the first fine uneven pattern 102 corresponding to the third fine uneven pattern 107 on the surface of the first resin layer 103 and then curing the first resin layer 103 by carrying out irradiation with light and a step (a3) of peeling off the mold 108 from the first resin layer 103 obtained by curing.

Here, the light to be used is not particularly limited as long as the light cures the first resin layer 103 and examples thereof include ultraviolet light, visible light, infrared light, and the like. For the purpose of promoting curing, the curing may be combined with heating, or heating may be performed after photocuring. The heating temperature preferably means room temperature (usually meaning 25° C.) or higher and 200° C. or lower, and more preferably room temperature or higher and 150° C. or lower. The heating temperature is suitably selected in consideration of the heat resistance and productivity of the processed substrate (substrate 101), the first resin layer 103, and the mold 108.

The irradiated light is not particularly limited as long as it is possible to impart energy causing a radical reaction or ion reaction by irradiating the photocuring initiator (C) with light. As the light source, it is possible to use a light beam having a wavelength of 400 nm or less, for example, a low pressure mercury lamp, a medium pressure mercury lamp, a high pressure mercury lamp, an ultra-high pressure mercury lamp, a chemical lamp, a black light lamp, a microwave excitation mercury lamp, a metal halide lamp, i rays, G rays, KrF excimer laser light, or ArF excimer laser light.

The amount of accumulated light on the first resin layer 103 is not particularly limited and is able to be set to, for example, 3 to 3000 mJ/cm$^2$.

(Step (b))

Next, as shown in (b) of FIG. 1, by etching the surface of the first fine uneven pattern 102 using the first resin layer 103 as a mask, the second fine uneven pattern 105 corresponding to the first fine uneven pattern 102 is formed on the surface 104 of the substrate 101.

First, in a case where the first resin layer 103 remains below the recess 102a forming the first fine uneven pattern 102, the first resin layer 103 present below the recess 102a forming the first fine uneven pattern 102 is removed and the surface 104 of the substrate 101 positioned below the recess 102a forming the first fine uneven pattern 102 is exposed.

Here, the method for removing the first resin layer 103 present below the recess 102a is not particularly limited, and it is possible to use a method known in the related art, for example, it is possible to use an etching process such as wet etching using an etching solution or dry etching using a reactive ion gas or a plasma gas. As described above, since the resin composition (P) according to the present embodiment includes a polymer having a specific structure, for example, changes in the etching rate with respect to the etching time are small in $O_2$ gas plasma etching performed in the initial process of the etching process. As a result, in $O_2$ gas plasma etching, there may be advantages such as "the shape being easily controlled" and "the process window being enlargeable". It is possible to effectively use this property in a case of producing a substrate with a minute structure, or in a method such as mass production.

Next, the surface 104 of the substrate 101 positioned below the recess 102a forming the first fine uneven pattern 102 is etched.

The etching method for the substrate 101 is not particularly limited and, for example, it is possible to perform the etching by wet etching using an etching solution or dry etching using an etching gas.

Here, the etching solution is appropriately selected according to the material of the substrate 101, for example, in a case of using an acidic aqueous solution, it is possible to use hydrogen fluoride, nitric acid aqueous solution, or the like, and in a case of using an alkaline aqueous solution, it is possible to use hydroxylated sodium, potassium hydroxide, sodium carbonate, sodium silicate, sodium metasilicate, aqueous ammonia solution, and the like. For example, it is also possible to add an appropriate amount of a water-soluble organic solvent such as an alcohol such as methanol or ethanol, or a surfactant to the acidic aqueous solution or the alkaline aqueous solution. Furthermore, it is also possible to use an etching solution containing an organic solvent. Examples of the organic solvent include esters, ketones, ethers, alcohols, amides, hydrocarbons, and the like.

In the wet etching described above, after etching, a predetermined uneven pattern is formed by washing and drying.

The etching gas used for the dry etching described above is appropriately selected according to the material of the substrate 101 and, for example, it is possible to use a gas including oxygen atoms such as $O_2$, CO, and $CO_2$; an inert gas such as He, $N_2$, and Ar; chlorine-based gases such as $Cl_2$ and $BCl_3$; fluorine-based gases such as $CHF_3$ and $CF_4$; and gases such as $H_2$ and $NH_3$. As the etching gas, one type of the above may be used alone, or two types or more may be used at the same time or at different timings. Furthermore, from the viewpoint of productivity, the dry etching process may be performed by heating the interior of the etching chamber. The resin composition (P) according to the present embodiment has particularly favorable resistance to dry etching.

(Step (c))

Next, as necessary, as shown in (c) of FIG. 1, the step (c) of removing the first resin layer 103 positioned above the protrusion 105a forming the second fine uneven pattern 105 may be further performed.

The method for removing the first resin layer 103 is not particularly limited, for example, it is possible to remove the first resin layer 103 by a cleaning process using a stripping solution or by dry etching using an etching gas.

As described above, according to the method of producing the substrate 101a with a fine uneven pattern according to the present embodiment, it is possible to obtain a substrate with a fine uneven pattern with excellent dimensional precision.

The method of producing the substrate 101a with a fine uneven pattern according to the present embodiment is excellent in productivity and excellent in terms of the processing dimensions and precision of the fine uneven pattern of the obtained substrate 101a with a fine uneven pattern.

EXAMPLES

A detailed description of the present embodiment will be given below, with reference to Examples. The present embodiment is not limited to the descriptions of these Examples. Here, the evaluation method for the polymers synthesized in the Examples, the nanoimprint molding method, the observation method for a fine uneven pattern, and the various gas etching methods are described below.

[Weight Average Molecular Weight (Mw), Molecular Weight Distribution (Mw/Mn)]

The weight average molecular weight (Mw) and number-average molecular weight (Mn) of the polymer dissolved in tetrahydrofuran (THF) or trifluoromethyltoluene (TFT) are measured by calibrating the molecular weights according to polystyrene standards using gel permeation chromatography (GPC) under the following conditions.

Detector: RI-2031 and 875-UV produced by JASCO Corporation or Model 270 produced by Viscotec, Serial connection columns: Shodex K-806M, 804, 803, 802.5, Column temperature: 40° C., Flow rate: 1.0 ml/min, Sample concentration: 3.0 to 9.0 mg/ml.

[Hydrogenation Ratio of Fluorine-Containing Cyclic Olefin Polymer (A)]

A powder of a ring-opening metathesis polymer subjected to a hydrogenation reaction was dissolved in deuterated chloroform, deuterated tetrahydrofuran, or a mixed solvent of hexafluorobenzene and deuterated chloroform, and the hydrogenation ratio was calculated from the integral value of an absorption spectrum derived from hydrogen bonded to the double bond carbon of the main chain where $\delta$=4.5 to 7.0 ppm using a 270 MHz-$^1$H-NMR spectrum.

[Glass Transition Temperature]

Using a DSC-50, manufactured by Shimadzu Corporation, the glass-transition temperature of a measurement sample was measured by heating at a heating rate of 10° C./min in a nitrogen atmosphere.

[Measurement of Surface Tension]

Using DY-300 manufactured by Kyowa Interface Science, Inc., 16 g of a sample was weighed in a petri dish having a diameter of 6 cm as a measurement chamber, three measurements were carried out on the same sample by the Wilhelmy method, and the average value thereof was set as the surface tension (mN/m).

[Measurement of Viscosity Tension]

Using a cone type B-type viscometer produced by Brookfield, 2 mL of a sample on a sample table thermostated at 23 to 25° C. was measured and brought into contact with a cone with a diameter of 75 mm, the viscosity thereof was measured while stepwise increasing the shear rate in a range of 10 to 1000/s, and, from the graph of the measurement results, the average value of the viscosity in a region showing a constant value with respect to the shear rate was defined as the viscosity (mPas).

[Ultraviolet Curing]

Using a nanoimprint apparatus X-100U produced by SCIVAX, a photocurable resin composition was cured by being irradiated with ultraviolet light with a wavelength of 365 nm using a high brightness LED as a light source.

[Observation of Fine Uneven Pattern]

A scanning electron microscope JSM-6701F (referred to below as SEM) manufactured by JASCO Corporation was used for the observation of the lines, spaces, and cross-sections of the film-shaped transfer body, on which the fine uneven pattern was transferred, and the film thickness measurement. The widths of the lines and spaces were calculated from an average value obtained by arbitrarily selecting patterns at three points from the cross-sectional photograph of the SEM and measuring ½ of the height of each of the lines and spaces at the measurement position.

[Mold Used for Imprinting]

A quartz mold with a line and space pattern shape was used and, in the mold dimensions, the width of the protrusion was represented as L1, the protrusion-protrusion distance was represented as L2, and the height of the protrusion was represented as L3. A portion having a pattern in which each of the dimensions of the mold A were L1=75 nm, L2=75 nm, and L3=150 nm was used for transferability evaluation.

[Plasma Etching Characteristic Evaluation]

As etching gases, five types were used: $O_2$, $Cl_2$, $Cl_2/BCl_3$ (mixing volume ratio=3/7), $CF_4$, and $CHF_3$.

An RIH1515Z parallel plate plasma processing apparatus manufactured by ULVAC, Inc. was used. First, a sample was placed in a chamber and the chamber was depressurized to 1 Pa or less. Next, each etching gas was introduced into each chamber at 30 sccm, the pressure in the chamber was maintained at 7 Pa, and then 13.56 MHz high frequency power was applied thereto to perform plasma discharging and carry out plasma processing. The plasma processing time was in the range of 10 to 90 seconds, depending on the type of etching gas.

[Method for Measuring Etching Rate]

Using a spectroscopic ellipsometer GES5E manufactured by Semilab Japan KK, the film thickness of the surface of the substrate after etching was measured at three points and the film thickness was calculated from the average value. The reduction amount in the film thickness due to etching was calculated from the film thickness before and after etching and time (sec) was plotted on the horizontal axis and the reduced film thickness amount (nm) was plotted on the vertical axis. The etching rate (nm/sec) was calculated from the slope of the obtained graph.

Example 1

$Mo(N-2,6-Pr^i_2C_6H_3)(CHCMe_2Ph)(OBu^t)_2$ (50 mg) was added to a tetrahydrofuran solution of 5,5,6-trifluoro-6-(trifluoromethyl) bicyclo[2.2.1]hept-2-ene (100 g) and 1-hexene (0.298 mg) and ring-opening metathesis polymerization was performed at 70° C. The olefin portion of the obtained polymer was subjected to a hydrogenation reaction at 160° C. with palladium alumina (5 g) to obtain a tetrahydrofuran solution of poly(1,1,2-trifluoro-2-trifluoromethyl-3,5-cyclopentylene ethylene).

The palladium alumina was removed by pressure-filtering the obtained solution with the filter with a pore diameter of 5 μm. Next, the obtained solution was added to methanol, and the white polymer was filtered and dried to obtain 99 g of polymer 1 which was the fluorine-containing cyclic olefin polymer (A). The obtained polymer 1 contained a structural unit represented by General Formula (1). In addition, the hydrogenation ratio was 100 mol %, the weight average molecular weight (Mw) was 70000, the molecular weight distribution (Mw/Mn) was 1.71, and the glass transition temperature was 107° C.

Next, a solution was prepared in which 20 g [mass ratio ((A)/(B))=60/40] of a mixture of bis(3-ethyl-3-oxetanylmethyl) ether and 1,7-octadiene diepoxide at a mass ratio of 9/1 as the photocurable compound (B) and 0.8 g of Adeka-optomer SP-172 (produced by Adeka Corp.) as the photo-curing initiator (C) were added to 100 g of a cyclohexanone solution in which the polymer 1 was dissolved at a concentration of 30% by mass. Next, this solution was pressure-filtered with a filter with a pore diameter of 1 μm and further filtered with a 0.1 μm filter to prepare a photocurable resin composition 1.

The photocurable resin composition 1 was spin-coated on a 4-inch silicon wafer and dried under conditions of 90° C. for 30 seconds in a nitrogen atmosphere. Next, with respect to the obtained coating film, the coating film was cured with an irradiation amount of 1000 mJ/cm². The thickness of the obtained cured film formed on the silicon wafer was 260 nm.

The obtained cured film formed on the silicon wafer was subjected to $O_2$ gas plasma etching for 10 seconds, 20 seconds, and 30 seconds, and plasma etching with other gases for 30 seconds, 60 seconds, and 90 seconds, respectively.

The film thicknesses after etching were measured with an ellipsometer and the etching rates were calculated for various gases. As a result, the etching rate ratio $(O_2)/(VG)$ of oxygen gas ($O_2$) to the various gases (VG) was 3.40 in a case where the gas was $Cl_2$, 3.51 in a case of $Cl_2/BCl_3$ (mixing volume ratio=3/7), 3.34 in a case of $CF_4$, and 27.7 in a case of $CHF_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 2

In the same manner as in Example 1 except that the monomer was changed to 5,6-difluoro-5-trifluoromethyl-6-perfluoroethylbicyclo[2.2.1]hept-2-ene (50 g), 49 g of polymer 2 [poly(1,2-difluoro-1-trifluoromethyl-2-perfluoroethyl-3,5-cyclopentylene ethylene)], which was the fluorine-containing cyclic olefin polymer (A), was obtained. The obtained polymer 2 contained a structural unit represented by General Formula (1). The hydrogenation ratio was 100 mol %, the weight average molecular weight (Mw) was 80,000, the molecular weight distribution (Mw/Mn) was 1.52, and the glass transition temperature was 110° C.

Next, a photocurable resin composition 2 was prepared in the same manner as in Example 1 except that the content of the photocurable compound (B) was changed to 3 g [mass ratio ((A)/(B))=90/10] and the photocuring initiator (C), Adeka Optomer SP-172 (produced by Adeka Corp.), was changed to 0.1 g.

A cured film of the photocurable resin composition 2 was formed with a thickness of 210 nm on a silicon wafer using the same method as in Example 1 and plasma etching evaluation was performed.

As a result, the etching rate ratio $(O_2)/(VG)$ of the oxygen gas $(O_2)$ to the various gases (VG) was 3.61 in a case where the gas was $Cl_2$, 3.63 in a case of $Cl_2/BCl_3$ (mixing volume ratio=3/7), 3.43 in a case of $CF_4$, and 36.3 in a case of $CHF_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 3

Using the same method as in Example 1 except that the monomer was changed to 5,5,6-trifluoro-6-(trifluoromethyl) bicyclo[2.2.1]hept-2-ene (50 g) and 8,8,9-trifluoro-9-(trifluoromethyl) tetracyclo[4.4.0.1$^{2,5}$.1$^{7,10}$]-3-dodecene (22 g), 71 g of polymer 3, which was the fluorine-containing cyclic olefin polymer (A), [a copolymer of poly(1,1,2-trifluoro-2-trifluoromethyl-3,5-cyclopentylene ethylene) and poly(3,3,4-trifluoro-4-trifluoromethyl-7,9, tricyclo[4.3.0.1$^{2,5}$]decanylene ethylene)] was obtained. The obtained polymer 3 contained a structural unit represented by General Formula (1). The hydrogenation ratio was 100 mol %, the weight average molecular weight (Mw) was 65000, the molecular weight distribution (Mw/Mn) was 2.41, and the glass transition temperature was 127° C.

Next, a photocurable resin composition 3 [mass ratio ((A)/(B))=60/40] was prepared in the same manner as in Example 1.

Using the same method as in Example 1, a cured film of the photocurable resin composition 3 was formed with a thickness of 280 nm on a silicon wafer and plasma etching evaluation was performed.

As a result, the etching rate ratio $(O_2)/(VG)$ of the oxygen gas $(O_2)$ to the various gases (VG) was 3.24 in a case where the gas was $Cl_2$, 3.28 in a case of $Cl_2/BCl_3$ (mixing volume ratio=3/7), 3.32 in a case of $CF_4$, and 45.0 in a case of $CHF_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 4

Using the same method as in Example 1 except that the content of the photocurable compound (B) was changed to 270 g and Adeka Optomer SP-172 (produced by Adeka Corp.) as the photocuring initiator (C) was changed to 11 g, a photocurable resin composition 4 [mass ratio ((A)/(B))=10/90] was prepared.

Using the same method as in Example 1, a cured film of the photocurable resin composition 4 was formed with a thickness of 330 nm on a silicon wafer and plasma etching evaluation was performed.

As a result, the etching rate ratio $(O_2)/(VG)$ of the oxygen gas $(O_2)$ to the various gases (VG) was 4.00 in a case where the gas was $Cl_2$, 4.11 in a case of $Cl_2/BCl_3$ (mixing volume ratio=3/7), 4.37 in a case of $CF_4$, and 62.0 in a case of $CHF_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 5

Using the same method as in Example 1 except that the type of the photocurable compound (B) was changed to 45 g of a mixture of bis(3-ethyl-3-oxetanylmethyl) ether and 1-epoxydecane in a mass ratio of 9/1 and the photocuring initiator (C) was changed to 2.3 g of Irgacure 290 (BASF Co., Ltd.), a photocurable resin composition 5 (mass ratio ((A)/(B))=40/60) was prepared.

Using the same method as in Example 1, a cured film of the photocurable resin composition 5 was formed with a thickness of 250 nm on a silicon wafer and plasma etching evaluation was performed.

As a result, the etching rate ratio $(O_2)/(VG)$ of the oxygen gas $(O_2)$ to the various gases (VG) was 3.88 in a case where the gas was $Cl_2$, 3.96 in a case of $Cl_2/BCl_3$ (mixing volume ratio=3/7), 3.86 in a case of $CF_4$, and 49.2 in a case of $CHF_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 6

The photocurable resin composition 1 prepared in Example 1 was spin-coated on the surface of a quartz glass substrate and dried under conditions of 90° C. for 30 seconds to obtain a resin layer formed of the photocurable resin composition 1. Then, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the quartz glass substrate was observed using an SEM and, as a result, the pattern of the quartz mold in which L1=75 nm, L2=75 nm, and L3=150 nm was reproduced with high precision. In addition, the height from the surface of the quartz glass substrate to the bottom surface of the recess of the fine uneven pattern was 158 nm.

Next, $O_2$ gas plasma etching was performed on the quartz glass substrate on which the fine uneven pattern was formed with the photocurable resin composition 1 and then the gas type was changed to $CF_4/O_2$ (mixing volume ratio=96/4) to perform plasma etching. When the cross-section of the substrate after plasma etching was observed, a groove having dimensions of a width of 75 nm and a depth of 80 nm was formed in the direction of the quartz glass substrate from the interface of the quartz glass substrate and the resin layer formed of the photocurable resin composition 1.

After that, $O_2$ gas plasma etching was performed again to completely remove the resin layer formed of the photocurable resin composition 1. Due to this, a quartz glass substrate having a fine uneven pattern (groove) with excellent dimensional precision was obtained.

Example 7

The photocurable resin composition 2 prepared in Example 2 was spin-coated on the surface of an aluminum substrate and dried at 90° C. for 30 seconds to obtain a resin layer formed of the photocurable resin composition 2. Then, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the aluminum substrate was observed using an SEM and, as a result, the pattern of the quartz mold in which L1=75 nm, L2=75 nm, and L3=150 nm was reproduced with high precision. In addition, the height from the surface of the aluminum substrate to the bottom surface of the recess of the fine uneven pattern was 163 nm.

Next, O$_2$ gas plasma etching was performed on the aluminum substrate on which the fine uneven pattern was formed using the photocurable resin composition 2 and then the gas type was changed to Cl$_2$/BCl$_3$ (mixing volume ratio=3/7) to perform plasma etching. When the cross-section of the substrate after plasma etching was observed, a groove having dimensions of a width of 75 nm and a depth of 100 nm was formed in the direction of the aluminum substrate from the interface of the aluminum substrate and the resin layer formed of the photocurable resin composition 2.

Thereafter, the aluminum substrate was immersed in cyclohexanone to wash the surface of the aluminum substrate and the resin layer formed of the photocurable resin composition 2 was completely removed. Due to this, an aluminum substrate having a fine uneven pattern (grooves) with excellent dimensional precision was obtained.

Example 8

10.8 g of a mixture of bis(3-ethyl-3-oxetanylmethyl) ether and 3',4'-epoxycyclohexylmethyl-3,4-epoxycyclohexane carboxylate in a mass ratio of 8/2 as the photocurable compound (B) [mass ratio ((A)/(B))=20/80] and 0.5 g of CPI-210S (produced by San-Apro) as the photocuring initiator (C) were added to 100 g of a propylene glycol diacetate solution in which polymer 1 synthesized in Example 1 was dissolved at a concentration of 2.7% by mass to prepare a solution. Next, this solution was pressure-filtered with a filter with a pore diameter of 1 μm and further filtered with a 0.1 μm filter to prepare a photocurable resin composition 9. The surface tension of the photocurable resin composition 9 was 31 mN/m and the viscosity was 5.3 mPas.

Next, the photocurable resin composition 9 was ink jet coated in a range of 50 mm×50 mm on a 4-inch silicon wafer by an ink jet coater and air-dried at room temperature, then the coating film was cured at an irradiation amount of 2000 mJ/cm$^2$. The thickness of the obtained cured film formed on the silicon wafer was 200 nm. As a result of the plasma etching evaluation, the etching rate ratio (O$_2$)/(VG) of the oxygen gas (O$_2$) to the various gases (VG) was 3.78 in a case where the gas was Cl$_2$, 3.91 in a case of Cl$_2$/BCl$_3$ (mixing volume ratio=3/7), 3.56 in a case of CF$_4$, and 47.9 in a case of CHF$_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 9

Using the same method as in Example 8 except that the solvent was changed to propylene glycol monomethyl ether acetate and the dissolution concentration of polymer 1 was changed to 4.0 mass %, a photocurable resin composition 10 was prepared with a mass ratio ((A)/(B))=60/40. The surface tension of the photocurable resin composition 10 was 28 mN/m and the viscosity was 5.4 mPas.

Next, the photocurable resin composition 10 was ink jet coated in the range of 50 mm×50 mm on a 4-inch silicon wafer with an ink jet coater and air-dried at room temperature and then the coating film was cured with an irradiation amount of 2000 mJ/cm$^2$. The thickness of the obtained cured film formed on the silicon wafer was 230 nm.

As a result of the plasma etching evaluation, the etching rate ratio (O$_2$)/(VG) of the oxygen gas (O$_2$) to the various gases (VG) was 3.40 in a case where the gas was Cl$_2$, 3.51 in a case of Cl$_2$/BCl$_3$ (mixing volume ratio=3/7), 3.34 in a case of CF$_4$, and 27.7 in a case of CHF$_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 10

In the same manner as Example 8 except that the fluorine-containing cyclic olefin polymer (A) was changed to the polymer 2 synthesized in Example 2, a photocurable resin composition 11 was prepared with a mass ratio ((A)/(B))=20/80. The surface tension of the photocurable resin composition 11 was 32 mN/m and the viscosity was 7.3 mPas.

Next, the photocurable resin composition 11 was ink jet coated in the range of 50 mm×50 mm on a 4-inch silicon wafer with an ink jet coater and air-dried at room temperature and then the coating film was cured with an irradiation amount of 2000 mJ/cm$^2$. The thickness of the obtained cured film formed on the silicon wafer was 240 nm.

As a result of the plasma etching evaluation, the etching rate ratio (O$_2$)/(VG) of the oxygen gas (O$_2$) to the various gases (VG) was 3.64 in a case where the gas was Cl$_2$, 3.61 in a case of Cl$_2$/BCl$_3$ (mixing volume ratio=3/7), 3.44 in a case of CF$_4$, and 37.1 in a case of CHF$_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Example 11

The photocurable resin composition 3 prepared in Example 3 was spin-coated on the surface of a quartz substrate and dried at 90° C. for 30 seconds to obtain a resin layer formed of the photocurable resin composition 3. Then, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the aluminum substrate was observed using an SEM and, as a result, the pattern of the quartz mold in which L1=75 nm, L2=75 nm, and L3=150 nm was reproduced with high precision. In addition, the height from the surface of the aluminum substrate to the bottom surface of the recess of the fine uneven pattern was 161 nm.

Next, O$_2$ gas plasma etching was performed on the quartz glass substrate on which the fine uneven pattern was formed using the photocurable resin composition 3 and then the gas type was changed to $CF_4/O_2$ (mixing volume ratio=96/4) to perform plasma etching. When the cross-section of the substrate after plasma etching was observed, a groove having dimensions of a width of 75 nm and a depth of 82 nm was formed in the direction of the quartz glass substrate from the interface of the quartz glass substrate and the resin layer formed of the photocurable resin composition 3.

After that, $O_2$ gas plasma etching was performed again to completely remove the resin layer formed of the photocurable resin composition 3. Due to this, a quartz glass substrate having a fine uneven pattern (groove) with excellent dimensional precision was obtained.

Example 12

The photocurable resin composition 4 prepared in Example 4 was spin-coated on the surface of an aluminum substrate and dried at 90° C. for 30 seconds to obtain a resin layer formed of the photocurable resin composition 4. Next, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the aluminum substrate was observed using an SEM and, as a result, the pattern of the quartz mold in which L1=75 nm, L2=75 nm, and L3=150 nm was reproduced with high precision. In addition, the height from the surface of the aluminum substrate to the bottom surface of the recess of the fine uneven pattern was 153 nm.

Next, $O_2$ gas plasma etching was performed on the quartz glass substrate on which the fine uneven pattern was formed using the photocurable resin composition 4 and then the gas type was changed to $CF_4/O_2$ (mixing volume ratio=96/4) to perform plasma etching. When the cross-section of the substrate after plasma etching was observed, a groove having dimensions of a width of 75 nm and a depth of 95 nm was formed in the direction of the quartz glass substrate from the interface of the quartz glass substrate and the resin layer formed of the photocurable resin composition 4.

After that, $O_2$ gas plasma etching was performed again to completely remove the resin layer formed of the photocurable resin composition 4. Due to this, a quartz glass substrate having a fine uneven pattern (groove) with excellent dimensional precision was obtained.

Example 13

The photocurable resin composition 5 prepared in Example 5 was spin-coated on the surface of an aluminum substrate and dried at 90° C. for 30 seconds to obtain a resin layer formed of the photocurable resin composition 5. Next, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the aluminum substrate was observed using an SEM and, as a result, the pattern of the quartz mold in which L1=75 nm, L2=75 nm, and L3=150 nm was reproduced with high precision. In addition, the height from the surface of the aluminum substrate to the bottom surface of the recess of the fine uneven pattern was 155 nm.

Next, $O_2$ gas plasma etching was performed on the quartz glass substrate on which the fine uneven pattern was formed using the photocurable resin composition 5 and then the gas type was changed to $CF_4/O_2$ (mixing volume ratio=96/4) to perform plasma etching. When the cross-section of the substrate after plasma etching was observed, a groove having dimensions of a width of 75 nm and a depth of 130 nm was formed in the direction of the quartz glass substrate from the interface of the quartz glass substrate and the resin layer formed of the photocurable resin composition 5.

After that, $O_2$ gas plasma etching was performed again to completely remove the resin layer formed of the photocurable resin composition 5. Due to this, a quartz glass substrate having a fine uneven pattern (groove) with excellent dimensional precision was obtained.

Example 14

The photocurable resin composition 9 prepared in Example 8 was ink jet coated on the surface of a quartz glass substrate in a range of 50 mm×50 mm and air-dried at room temperature to obtain a resin layer formed of the photocurable resin composition 9. Then, the pattern surface of the line and space shaped quartz mold (the mold A) was brought into contact with the obtained resin layer and ultraviolet irradiation was performed at an irradiation amount of 2000 mJ/cm$^2$ while applying a pressure of 0.1 MPa. Thereafter, the quartz mold was peeled off and the cross-section of the line and space shape formed on the surface of the quartz glass substrate was observed using an SEM and, as a result, the pattern of the quartz mold in which L1=75 nm, L2=75 nm, and L3=150 nm was reproduced with high precision. In addition, the height from the surface of the quartz glass substrate to the bottom surface of the recess of the fine uneven pattern was 125 nm.

Next, $O_2$ gas plasma etching was performed on the quartz glass substrate on which the fine uneven pattern was formed using the photocurable resin composition 9 and then the gas type was changed to $CF_4/O_2$ (mixing volume ratio=96/4) to perform plasma etching. When the cross-section of the substrate after plasma etching was observed, a groove having dimensions of a width of 75 nm and a depth of 90 nm was formed in the direction of the quartz glass substrate from the interface of the quartz glass substrate and the resin layer formed of the photocurable resin composition 9.

After that, $O_2$ gas plasma etching was performed again to completely remove the resin layer formed of the photocurable resin composition 9. Due to this, a quartz glass substrate having a fine uneven pattern (groove) with excellent dimensional precision was obtained.

Example 15

Using the same method as in Example 11 except that the photocurable resin composition 10 prepared in Example 9 was used, a line and space shape was formed on the surface of a quartz glass substrate using a quartz mold (the mold A). As a result of observing the cross-section of the line and space shape using an SEM, the pattern of the quartz mold in which L1=75 nm, L2=75 nm, and L3=150 nm was reproduced with high precision. In addition, the height from the surface of the quartz glass substrate to the bottom surface of the recess of the fine uneven pattern was 155 nm.

Next, $O_2$ gas plasma etching was performed on the quartz glass substrate on which the fine uneven pattern was formed using the photocurable resin composition 10 and then the gas type was changed to $CF_4/O_2$ (mixing volume ratio=96/4)

to perform plasma etching. When the cross-section of the substrate after plasma etching was observed, a groove having dimensions of a width of 75 nm and a depth of 85 nm was formed in the direction of the quartz glass substrate from the interface of the quartz glass substrate and the resin layer formed of the photocurable resin composition 10.

After that, $O_2$ gas plasma etching was performed again to completely remove the resin layer formed of the photocurable resin composition 10. Due to this, a quartz glass substrate having a fine uneven pattern (groove) with excellent dimensional precision was obtained.

Example 16

Using the same method as in Example 11 except that the photocurable resin composition 11 prepared in Example 10 was used and the substrate was changed to an aluminum substrate, a line and space shape was formed on the surface of the aluminum substrate using the quartz mold (the mold A). As a result of observing the cross-section of the line and space shape using an SEM, the pattern of the quartz mold in which L1=75 nm, L2=75 nm, and L3=150 nm was reproduced with high precision. In addition, the height from the surface of the aluminum substrate to the bottom surface of the recess of the fine uneven pattern was 165 nm.

Next, $O_2$ gas plasma etching was performed on the aluminum substrate on which the fine uneven pattern was formed using the photocurable resin composition 11 and then the gas type was changed to $Cl_2/BCl_3$ (mixing volume ratio=3/7) to perform plasma etching. When the cross-section of the substrate after plasma etching was observed, a groove having dimensions of a width of 75 nm and a depth of 120 nm was formed in the direction of the aluminum substrate from the interface of the aluminum substrate and the resin layer formed of the photocurable resin composition 11.

Thereafter, the aluminum substrate was immersed in cyclohexanone to wash the surface of the aluminum substrate and the resin layer formed of the photocurable resin composition 11 was completely removed. Due to this, an aluminum substrate having a fine uneven pattern (grooves) with excellent dimensional precision was obtained.

Comparative Example 1

Commercially available ultraviolet curable type liquid silicone rubber used in resin layers for nanoimprinting (mixture of Shin-Etsu Silicone Co., Ltd., KER-4690-A liquid (10 g) and KER-4690-B liquid (10 g)) was used as a photocurable resin composition 6.

The photocurable resin composition 6 was spin-coated on a 4-inch silicon wafer and the coating film was cured with an irradiation amount of 1000 $mJ/cm^2$. The thickness of the obtained cured film formed on the silicon wafer was 240 nm.

The obtained cured film formed on the silicon wafer was subjected to $O_2$ gas plasma etching for 10 seconds, 20 seconds, and 30 seconds.

As the results of the plasma etching, in the initial period of the graph in which time (sec) was plotted on the horizontal axis and the film thickness reduction amount (nm) was plotted on the vertical axis, there was a linear rise, but there was no change in the reduction amount of the film thickness after 20 seconds and 30 seconds. That is, the results suggest that a component for which etching with $O_2$ gas was not possible remained and it was not possible to calculate the etching rate (nm/sec) calculated from a slope of a graph showing linearity.

The photocurable resin composition 6 was spin-coated on a quartz glass surface to obtain a resin layer formed of the photocurable resin composition 6.

Next, the pattern surface of the line and space shaped quartz mold (the mold A) was brought into contact with the obtained resin layer and ultraviolet irradiation was performed at an irradiation amount of 1000 $mJ/cm^2$ while applying a pressure of 0.1 MPa. Thereafter, the quartz mold was peeled off and the cross-section of the line and space shape formed on the surface of the quartz glass substrate was observed using an SEM and the results were L1=73 nm, L2=77 nm, and L3=145 nm. In addition, the height from the surface of the quartz glass substrate to the bottom surface of the recess of the fine uneven pattern was 120 nm.

Next, $O_2$ gas plasma etching was performed for a maximum of 180 seconds on the quartz glass substrate on which the fine uneven pattern was formed by the photocurable resin composition 6. However, although it was possible to etch the 120 nm thickness of the bottom of the recess of the fine uneven pattern to a thickness of 80 nm, it was not possible to completely remove the film and it was not possible to process the quartz glass substrate.

Comparative Example 2

In a propylene glycol-1-methylether-2-acetate (PGMEA) solution in which 30% by mass of a siloxane resin in which a substituent on Si was propoxy methacrylate was dissolved, a 2-benzyl-2-dimethylamino-1-(4-morpholinophenyl)-butan-1-one as a photopolymerization initiator was dissolved to prepare a photocurable resin composition 7. The amount of the 2-benzyl-2-dimethylamino-1-(4-morpholinophenyl)-butan-1-one was 3% by mass relative to the mass of the siloxane resin.

The photocurable resin composition 7 was spin-coated on a 4-inch silicon wafer and the coating film was cured with an irradiation amount of 1000 $mJ/cm^2$. The thickness of the obtained cured film formed on the silicon wafer was 220 nm.

The obtained cured film formed on the silicon wafer was subjected to $O_2$ gas plasma etching for 10 seconds, 20 seconds, and 30 seconds.

As the results of the plasma etching, in the initial period of the graph in which time (sec) was plotted on the horizontal axis and the film thickness reduction amount (nm) was plotted on the vertical axis, there was a linear rise, but there was no change in the reduction amount of the film thickness after 20 seconds and 30 seconds. That is, the results suggest that a component for which etching with $O_2$ gas was not possible remained and it was not possible to calculate the etching rate (nm/sec) calculated from the slope of the graph showing linearity.

The photocurable resin composition 7 was spin-coated on the surface of quartz glass to obtain a resin layer formed of the photocurable resin composition 7.

Next, the pattern surface of the line and space shaped quartz mold (the mold A) was brought into contact with the obtained resin layer and ultraviolet irradiation was performed at an irradiation amount of 1000 $mJ/cm^2$ while applying a pressure of 0.1 MPa. Thereafter, the quartz mold was peeled off and the cross-section of the line and space shape formed on the surface of the quartz glass substrate was observed using an SEM and the results were L1=74 nm, L2=76 nm, and L3=149 nm. In addition, the height from the surface of the quartz glass substrate to the bottom surface of the recess of the fine uneven pattern was 118 nm.

Next, O2 gas plasma etching was performed for a maximum of 180 seconds on the quartz glass substrate on which the fine uneven pattern was formed by the photocurable resin composition 7. However, although it was possible to etch the 118 nm thickness of the bottom surface of the recess of the fine uneven pattern to a thickness of 75 nm, it was not possible to completely remove the film and it was not possible to process the quartz glass substrate.

Comparative Example 3

In a cyclohexanone solution in which 10% by mass of methyl methacrylate was dissolved, 2-benzyl-2-dimethyl-amino-1-(4-morpholinophenyl)-butan-1-one as a photopolymerization initiator was dissolved to prepare a photocurable resin composition 8. The amount of the 2-benzyl-2-dimethylamino-1-(4-morpholinophenyl)-butan-1-one was 2% by mass relative to the mass of the methyl methacrylate.

The photocurable resin composition 8 was spin-coated on 4-inch silicon wafer and a coating film was cured at an irradiation amount of 1000 mJ/cm$^2$. The thickness of the obtained cured film formed on the silicon wafer was 250 nm.

Using the same method as in Example 1, O$_2$ gas plasma etching was performed for 10 seconds, 20 seconds, and 30 seconds on the obtained cured film formed on the silicon wafer.

As a result, the etching rate ratio (O$_2$)/(VG) between oxygen gas (O$_2$) and various gases (VG) was 0.75 in a case where the gas was Cl$_2$, 0.88 in a case of Cl$_2$/BCl$_3$ (mixing volume ratio=3/7), 1.01 in a case of CF$_4$, and 9.0 in a case of CHF$_3$, and, in particular, the O$_2$ etching rate increased (the resistance to the O$_2$ gas decreased) and the etching rate with respect to the various gases (VG) decreased. In addition, as the results of the plasma etching using various gases used for analysis, a graph in which time (sec) was plotted on the horizontal axis and the reduced film thickness amount (nm) was plotted on the vertical axis showed linearity for all types of gas.

The photocurable resin composition 8 was spin-coated on the quartz glass surface to obtain a resin layer formed of the photocurable resin composition 8.

Next, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, the quartz mold was peeled off and the cross-section of the line and space shape formed on the surface of the quartz glass substrate was observed using an SEM and the results were L1=70 nm, L2=80 nm, and L3=145 nm. In addition, the height from the surface of the quartz glass substrate to the bottom surface of the recess of the fine uneven pattern was 121 nm.

Next, O2 gas plasma etching was performed for a maximum of 180 seconds on the quartz glass substrate on which the fine uneven pattern was formed by the photocurable resin composition 8. When the cross-section of the sample after O$_2$ etching processing was observed using an SEM, a resin layer formed of the photocurable resin composition 8 disappeared due to insufficient resistance to the O$_2$ plasma etching and it was not possible to carry out etching processing for substrate processing in the next step.

Comparative Example 4

Using the same method as in Example 1 except that the monomer was changed to 3-methyl norbornene and the solvent was changed to cyclohexane, a polymer 4 which was a white solid (98 g) of poly(1-methyl-3,5-cyclopentylene ethylene) was obtained. The obtained polymer 4 contained a cyclic olefin polymer having no fluorine at the substituents R$^1$ to R$^4$ in the structural units represented by General Formula (1). In addition, the hydrogenation ratio was 100 mol %, the weight average molecular weight (Mw) was 81000, the molecular weight distribution (Mw/Mn) was 1.83, and the glass transition temperature was 95° C.

Next, using 100 g of a cyclohexane solution in which the polymer 4 was dissolved at a concentration of 30% by mass, a photocurable resin composition 12 was prepared by the same method as in Example 1.

The photocurable resin composition 12 was spin-coated on a 4-inch silicon wafer and dried at 90° C. for 30 seconds in a nitrogen atmosphere. Next, with respect to the obtained coating film, the coating film was cured with an irradiation amount of 1000 mJ/cm$^2$.

The thickness of the obtained cured film formed on the silicon wafer was 230 nm. In addition, the appearance of the obtained cured film was in a state in which the cyclic olefin polymer and the ultraviolet curing component were phase separated.

O$_2$ gas plasma etching was performed for 10 seconds, 20 seconds, and 30 seconds on the obtained cured film formed on the silicon wafer and plasma etching was carried out with other gases for 30 seconds, 60 seconds, and 90 seconds, respectively.

The film thickness after etching was measured with an ellipsometer and the etching rates were calculated for various gases. As a result, the etching rate ratio (O$_2$)/(VG) between oxygen gas (O$_2$) and various gases (VG) was 3.10 in a case where the gas was Cl$_2$, 3.21 in a case of Cl$_2$/BCl$_3$ (mixing volume ratio=3/7), 2.94 in a case of CF$_4$, and 22.2 in a case of CHF$_3$. In addition, as the results of the plasma etching using various gases used for analysis, a graph in which time (sec) was plotted on the horizontal axis and the reduced film thickness amount (nm) was plotted on the vertical axis showed linearity for all types of gas.

Next, the photocurable resin composition 12 was spin-coated on the surface of a quartz glass substrate and dried at 90° C. for 30 seconds to obtain a resin layer formed of the photocurable resin composition 12. Next, the pattern surface of the line and space shaped quartz mold (the mold A) was brought into contact with the obtained resin layer and ultraviolet irradiation was performed at an irradiation amount of 1000 mJ/cm$^2$ while applying a pressure of 0.1 MPa. Thereafter, peeling of the quartz mold was attempted, but the mold and the cured product of the photocurable resin composition 12 were strongly adhered and peeling was not possible.

The above results are shown in Table 1 and Table 2.

TABLE 1

|  | Example 1 | Example 2 | Example 3 | Example 4 | Example 5 | Example 8 | Example 9 |
|---|---|---|---|---|---|---|---|
| <Polymer> | | | | | | | |
| Type | Polymer 1 | Polymer 2 | Polymer 3 | Polymer 1 | Polymer 1 | Polymer 1 | Polymer 1 |
| Hydrogenation ratio (mol %) | 100 | 100 | 100 | 100 | 100 | 100 | 100 |

TABLE 1-continued

|  |  |  |  |  |  |  |  |
|---|---|---|---|---|---|---|---|
| Mw | 70000 | 80000 | 65000 | 70000 | 70000 | 70000 | 70000 |
| Mw/Mn | 1.71 | 1.52 | 2.41 | 1.71 | 1.71 | 1.71 | 1.71 |
| Glass transition temperature (° C.) | 107 | 110 | 127 | 107 | 107 | 107 | 107 |
| <Resin Layer> |  |  |  |  |  |  |  |
| Type | Resin composition 1 | Resin composition 2 | Resin composition 3 | Resin composition 4 | Resin composition 5 | Resin composition 9 | Resin composition 10 |
| (A)/(B) | 60/40 | 90/10 | 60/40 | 10/90 | 40/60 | 20/80 | 60/40 |
| Surface tension (mN/m) | — | — | — | — | — | 31 | 28 |
| Viscosity (mPas) | — | — | — | — | — | 5.3 | 5.4 |
| Coating method | Spin coating | Spin coating | Spin coating | Spin coating | Spin coating | Ink jet coating | Ink jet coating |
| Coating film thickness (nm) | 260 | 210 | 280 | 330 | 250 | 200 | 230 |
| <Etching evaluation> |  |  |  |  |  |  |  |
| Etching rate ratio between oxygen gas and various gases — $Cl_2$ | 3.40 | 3.61 | 3.24 | 4.00 | 3.88 | 3.78 | 3.40 |
| $Cl_2/BCl_3$ | 3.51 | 3.63 | 3.28 | 4.11 | 3.96 | 3.91 | 3.51 |
| $CF_4$ | 3.34 | 3.43 | 3.32 | 4.37 | 3.86 | 3.56 | 3.34 |
| $CHF_3$ | 27.7 | 36.3 | 45.0 | 62.0 | 49.2 | 47.9 | 27.7 |
| Graph of time and film thickness reduction amount | Linearity | Linearity | Linearity | Linearity | Linearity | Linearity | Linearity |

|  | Example 10 | Comparative Example 1 | Comparative Example 2 | Comparative Example 3 | Comparative Example 4 |
|---|---|---|---|---|---|
| <Polymer> |  |  |  |  |  |
| Type | Polymer 2 | Ultraviolet curable-type liquid silicone rubber | Siloxane-based methacrylate resin | Polymethyl methacrylate | Polymer 4 |
| Hydrogenation ratio (mol %) | 100 |  |  |  | 100 |
| Mw | 80000 |  |  |  | 81000 |
| Mw/Mn | 1.52 |  |  |  | 1.83 |
| Glass transition temperature (° C.) | 110 |  |  |  | 95 |
| <Resin Layer> |  |  |  |  |  |
| Type | Resin composition 11 | Resin composition 6 | Resin composition 7 | Resin composition 8 | Resin composition 12 |
| (A)/(B) | 20/80 | — | — | — | 60/40 |
| Surface tension (mN/m) | 32 | — | — | — | — |
| Viscosity (mPas) | 7.3 | — | — | — | — |
| Coating method | Ink jet coating | Spin coating | Spin coating | Spin coating | Spin coating |
| Coating film thickness (nm) | 240 | 240 | 220 | 250 | 230 |
| <Etching evaluation> |  |  |  |  |  |
| Etching rate ratio between oxygen gas and various gases — $Cl_2$ | 3.64 | Measuring not possible | Measuring not possible | 0.75 | 3.10 |
| $Cl_2/BCl_3$ | 3.61 |  |  | 0.88 | 3.21 |
| $CF_4$ | 3.44 |  |  | 1.01 | 2.94 |
| $CHF_3$ | 37.1 |  |  | 9.0 | 22.2 |
| Graph of time and film thickness reduction amount | Linearity | No change from part-way through | No change from part-way through | Linearity | Linearity |

TABLE 2

|  |  | Example 6 | Example 7 | Example 11 | Example 12 | Example 13 | Example 14 | Example 15 |
|---|---|---|---|---|---|---|---|---|
| Photocurable resin composition | | Resin composition 1 | Resin composition 2 | Resin composition 3 | Resin compositeon 4 | Resin composition 5 | Resin composition 9 | Resin composition 10 |
| Substrate | | Quartz glass | Aluminum | Quartz glass | Quartz glass | Quartz glass | Quartz glass | Quartz glass |
| Pattern after ultraviolet irradiation | L1 [nm] | 75 | 75 | 75 | 75 | 75 | 75 | 75 |
| | L2 [nm] | 75 | 75 | 75 | 75 | 75 | 75 | 75 |
| | L3 [nm] | 150 | 150 | 150 | 150 | 150 | 150 | 150 |
| | Recess bottom surface from substrate surface (nm) | 158 | 163 | 161 | 153 | 155 | 125 | 155 |
| Plasma etching | Gas type | $CF_4/O_2$ | $Cl_2/BCl_3$ | $CF_4/O_2$ | $CF_4/O_2$ | $CF_4/O_2$ | $CF_4/O_2$ | $CF_4/O_2$ |
| | Groove width (nm) | 75 | 75 | 75 | 75 | 75 | 75 | 75 |
| | Groove depth (nm) | 80 | 100 | 82 | 95 | 130 | 90 | 85 |
| $O_2$ plasma etching or washing | Resin | Completely removed | Completely removed | Completely removed | Completely removed | Completely removed | Completely removed | Completely removed |
| | Substrate | Groove formed | Groove formed | Groove formed | Groove formed | Groove formed | Groove formed | Groove formed |

|  |  | Example 16 | Comparative Example 1 | Comparative Example 2 | Comparative Example 3 | Comparative Example 4 |
|---|---|---|---|---|---|---|
| Photocurable resin composition | | Resin composition 11 | Resin composition 6 | Resin composition 7 | Resin composition 8 | Resin composition 12 |
| Substrate | | Aluminum | Quartz glass | Quartz class | Quartz glass | Quartz glass |
| Pattern after ultraviolet irradiation | L1 [nm] | 75 | 73 | 74 | 70 | Strong adhesion to mold and peeling was not possible |
| | L2 [nm] | 75 | 77 | 76 | 80 | |
| | L3 [nm] | 150 | 145 | 149 | 145 | |
| | Recess bottom surface from substrate surface (nm) | 165 | 120 | 118 | 121 | |
| Plasma etching | Gas type | $Cl_2/BCl_3$ | Processing not possible | Processing not possible | Processing not possible | — |
| | Groove width (nm) | 75 | | | | — |
| | Groove depth (nm) | 120 | | | | — |
| $O_2$ plasma etching or washing | Resin | Completely removed | Complete removal not possible | Complete removal not possible | Resin layer disappeared | — |
| | Substrate | Groove formed | Groove formation not possible | Groove formation not possible | Groove formation not possible | — |

As is understood from Table 1, in the resin layer including the fluorine-containing cyclic olefin polymer (A), the etching rate ratio ($O_2$)/(VG) of oxygen gas ($O_2$) to various gases (VG) was large and the etching property was excellent. That is, it is understood that while it is possible to etch the resin layer including the fluorine-containing cyclic olefin polymer (A) by $O_2$ gas plasma etching, the etching resistance to the various etching gases for etching the substrate is excellent. Since the etching resistance to various etching gases for etching the substrate is excellent, it is possible to etch the substrate more selectively when the substrate is etched using the resin layer having the fine uneven pattern as a mask, and, as a result, it is possible to transfer the fine uneven pattern formed on the resin layer to the substrate with high precision.

In addition, as is understood from Examples 6, 7, and 11 to 16 in Table 2, when the resin layer including the fluorine-containing cyclic olefin polymer (A) is used, it is understood that it is possible to transfer the fine uneven pattern formed on the resin layer to the substrate with high precision.

This application claims priority based on Japanese Patent Application No. 2017-114363 filed on Jun. 9, 2017, the entire disclosure of which is incorporated herein.

The present invention includes the following aspects.

1.

A method of producing a substrate with a fine uneven pattern, the method including a step (a) of preparing a laminate provided with a substrate and a first resin layer provided on the substrate and having a first fine uneven pattern formed on a surface thereof; and a step (b) of forming a second fine uneven pattern corresponding to the first fine uneven pattern on the surface of the substrate by etching the surface of the first fine uneven pattern using the first resin layer as a mask, in which the first resin layer is formed of a resin composition (P) including a fluorine-containing cyclic olefin polymer (A) or a cured product of the resin composition (P).

2.

The method of producing a substrate with a fine uneven pattern according to 1., in which the fluorine-containing cyclic olefin polymer (A) includes a repeating structural unit represented by General Formula (1).

[Chem. 9]

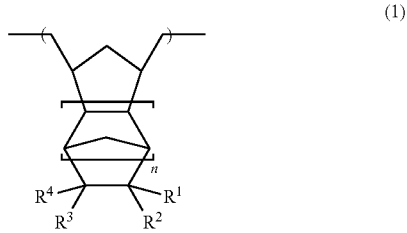

(1)

(In General Formula (1), at least one of $R^1$ to $R^4$ is an organic group selected from fluorine, an alkyl group having 1 to 10 carbon atoms containing fluorine, an alkoxy group having 1 to 10 carbon atoms containing fluorine, an alkoxyalkyl group having 2 to 10 carbon atoms containing fluorine. When $R^1$ to $R^4$ are groups which do not contain fluorine, $R^1$ to $R^4$ are organic groups selected from hydrogen, an alkyl group having 1 to 10 carbon atoms, an alkoxy group having 1 to 10 carbon atoms, and an alkoxyalkyl group having 2 to 10 carbon atoms. $R^1$ to $R^4$ may be the same or different. $R^1$ to $R^4$ may be bonded to each other to form a ring structure. n represents an integer of 0 to 2.)

3.

The method of producing a substrate with a fine uneven pattern according to 1. or 2., in which the resin composition (P) further includes a photocurable compound (B) and a photocuring initiator (C)

4.

The method of producing a substrate with a fine uneven pattern according to 3., in which a mass ratio ((A)/(B)) of a content of the fluorine-containing cyclic olefin polymer (A) to a content of the photocurable compound (B) in the resin composition (P) is 1/99 or more and 99/1 or less.

5.

The method of producing a substrate with a fine uneven pattern according to 3. or 4., in which the photocurable compound (B) includes a ring-opening polymerizable compound capable of cationic polymerization.

6.

The method of producing a substrate with a fine uneven pattern according to any one of 1. to 5., in which the step (a) includes a a step (a1) of pressing a mold having a fine uneven pattern on the first resin layer which is provided on the substrate and which includes the fluorine-containing cyclic olefin polymer (A) to form a fine uneven pattern corresponding to the fine uneven pattern of the mold.

7.

The method of producing a substrate with a fine uneven pattern according to 6., in which the step (a) further includes a step (a2) of curing the first resin layer by forming the first fine uneven pattern on the surface of the first resin layer and then carrying out irradiation with light, and a step (a3) of peeling off the mold from the first resin layer.

8.

The method of producing a substrate with a fine uneven pattern according to any one of 1. to 7., the method further including a step (c) of removing the first resin layer positioned above a protrusion which forms the second fine uneven pattern.

9.

The method of producing a substrate with a fine uneven pattern according to any one of 1. to 8., in which the substrate is selected from a quartz substrate, a silicon substrate, a nickel substrate, an aluminum substrate, and a sapphire substrate.

10.

A resin composition for forming the first resin layer in the method of producing a substrate with a fine uneven pattern according to any one of 1 to 9., the resin composition including a fluorine-containing cyclic olefin polymer (A), in which a ratio (($O_2$)/($CHF_3$)) of an etching rate ($O_2$) of $O_2$ gas and an etching rate ($CHF_3$) of $CHF_3$ gas measured by method 1 is 1 or more and 100 or less.

(Method 1: After coating the resin composition over a silicon wafer such that a thickness after curing is in a range of 200 nm or more and 350 nm or less, the obtained coating film is cured. Next, $O_2$ gas plasma etching is performed on the obtained cured film for 10 seconds, 20 seconds, and 30 seconds, respectively, a reduced film thickness amount of the cured film due to the $O_2$ gas plasma etching is calculated, time (sec) is plotted on a horizontal axis and the reduced film thickness amount (nm) is plotted on the vertical axis, and an etching rate ($O_2$) (nm/sec) of the $O_2$ gas is calculated from a slope of the obtained graph. Similarly, $CHF_3$ gas plasma etching is performed on the obtained cured film for 30 seconds, 60 seconds, and 90 seconds, respectively, a reduced film thickness amount of the cured film due to the $CHF_3$ gas plasma etching is calculated, time (sec) is plotted on a horizontal axis and the reduced film thickness amount (nm) is plotted on the vertical axis, and an etching rate ($CHF_3$) (nm/sec) of the $CHF_3$ gas is calculated from a slope of the obtained graph.)

The invention claimed is:

1. A method of producing a substrate with an uneven pattern, the method comprising:
a step (a) of preparing a laminate provided with a substrate and a first resin layer provided on the substrate and having a first uneven pattern formed on a surface thereof; and
a step (b) of forming a second uneven pattern corresponding to the first uneven pattern on the surface of the substrate by etching the surface of the first uneven pattern using the first resin layer as a mask,
wherein the first resin layer is formed of a resin composition (P) including a fluorine-containing cyclic olefin polymer (A) or a cured product of the resin composition (P),
wherein the fluorine-containing cyclic olefin polymer (A) includes a repeating structural unit represented by General Formula (1),

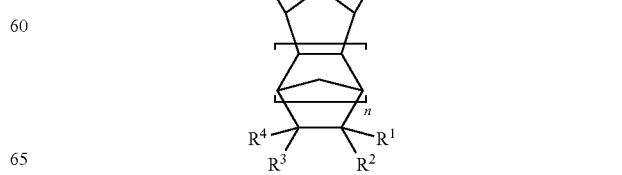

(1)

in General Formula (1), at least one of $R^1$ to $R^4$ is an organic group selected from fluorine, an alkyl group having 1 to 10 carbon atoms containing fluorine, an alkoxy group having 1 to 10 carbon atoms containing fluorine, an alkoxyalkyl group having 2 to 10 carbon atoms containing fluorine, when $R^1$ to $R^4$ are groups which do not contain fluorine, $R^1$ to $R^4$ are organic groups selected from hydrogen, an alkyl group having 1 to 10 carbon atoms, an alkoxy group having 1 to 10 carbon atoms, and an alkoxyalkyl group having 2 to 10 carbon atoms, $R^1$ to $R^4$ may be the same or different, $R^1$ to $R^4$ may be bonded to each other to form a ring structure, and n represents an integer of 0 to 2, and wherein the step (b) includes a step of etching with an $O_2$ gas and a step of etching with a gas other than $O_2$ gas.

2. The method of producing a substrate with an uneven pattern according to claim 1, the method further comprising:
a step (c) of removing the first resin layer positioned above a protrusion which forms the second uneven pattern.

3. The method of producing a substrate with an uneven pattern according to claim 1,
wherein the substrate is selected from a quartz substrate, a silicon substrate, a nickel substrate, an aluminum substrate, and a sapphire substrate.

4. A laminate in the method of producing a substrate with an uneven pattern according to claim 1, the laminate comprising:
a substrate; and
a first resin layer provided on the substrate and having a first uneven pattern formed on a surface thereof,
wherein the first resin layer is formed of a resin composition (P) including a fluorine-containing cyclic olefin polymer (A) or a cured product of the resin composition (P).

5. The method of producing a substrate with an uneven pattern according to claim 1,
wherein the uneven pattern means a structure provided with a protrusions and a recesses, in which an width of the protrusions and/or the recesses is 10 nm to 50 µm, a depth of the recesses and/or a height of the protrusions is 10 nm to 50 µm, and an aspect ratio which is a ratio of the width of the protrusions to the height of the protrusions is 0.1 to 500.

6. The method of producing a substrate with an uneven pattern according to claim 1,
wherein the step (a) includes a step (a1) of pressing a mold having an uneven pattern on the first resin layer which is provided on the substrate and which includes the fluorine-containing cyclic olefin polymer (A) to form an uneven pattern corresponding to the uneven pattern of the mold.

7. The method of producing a substrate with an uneven pattern according to claim 6,
wherein the step (a) further includes a step (a2) of curing the first resin layer after forming the first uneven pattern on the surface of the first resin layer and then carrying out irradiation with light, and a step (a3) of peeling off the mold from the first resin layer.

8. A resin composition for forming the first resin layer in the method of producing a substrate with an uneven pattern according to claim 1, the resin composition comprising:
a fluorine-containing cyclic olefin polymer (A).

9. The resin composition according to claim 8,
wherein a ratio (($O_2$)/($CHF_3$)) of an etching rate ($O_2$) of $O_2$ gas and an etching rate ($CHF_3$) of $CHF_3$ gas measured by method 1 is 1 or more and 100 or less, Method 1: After coating the resin composition over a silicon wafer such that a thickness after curing is in a range of 200 nm or more and 350 nm or less, the obtained coating film is cured, next, $O_2$ gas plasma etching is performed on the obtained cured film for 10 seconds, 20 seconds, and 30 seconds, respectively, a reduced film thickness amount of the cured film due to the $O_2$ gas plasma etching is calculated, time (sec) is plotted on a horizontal axis and the reduced film thickness amount (nm) is plotted on a vertical axis, and an etching rate ($O_2$) (nm/sec) of the $O_2$ gas is calculated from a slope of an obtained graph, similarly, $CHF_3$ gas plasma etching is performed on the obtained cured film for 30 seconds, 60 seconds, and 90 seconds, respectively, a reduced film thickness amount of the cured film due to the $CHF_3$ gas plasma etching is calculated, time (sec) is plotted on a horizontal axis and the reduced film thickness amount (nm) is plotted on a vertical axis, and an etching rate ($CHF_3$) (nm/sec) of the $CHF_3$ gas is calculated from a slope of an obtained graph.

10. The resin composition according to claim 8,
wherein a surface tension is 20 mN/m or more and 60 mN/m or less.

11. The method of producing a substrate with an uneven pattern according to claim 1,
wherein the resin composition (P) further includes a photocurable compound (B) and a photocuring initiator (C).

12. The method of producing a substrate with an uneven pattern according to claim 11,
wherein a mass ratio ((A)/(B)) of a content of the fluorine-containing cyclic olefin polymer (A) to a content of the photocurable compound (B) in the resin composition (P) is 1/99 or more and 99/1 or less.

13. The method of producing a substrate with an uneven pattern according to claim 11,
wherein the photocurable compound (B) includes a ring-opening polymerizable compound capable of cationic polymerization.

14. The method of producing a substrate with an uneven pattern according to claim 11,
wherein a surface tension of the resin composition (P) including the fluorine-containing cyclic olefin polymer (A) is 20 mN/m or more and 60 mN/m or less, and
the step (a) includes a step of coating the resin composition (P) over the substrate using an ink jet coating method to form the first resin layer.

15. A method of producing a substrate with an uneven pattern, the method comprising:
a step (a) of preparing a laminate provided with a substrate and a first resin layer provided on the substrate and having a first uneven pattern formed on a surface thereof, and
a step (b) of forming a second uneven pattern corresponding to the first uneven pattern on the surface of the substrate by etching the surface of the first uneven pattern using the first resin layer as a mask,
wherein the first resin layer is formed of a resin composition (P) including a fluorine-containing cyclic olefin polymer (A) or a cured product of the resin composition (P),
wherein a ratio (($O_2$)/($CHF_3$)) of an etching rate ($O_2$) of $O_2$ gas and an etching rate ($CHF_3$) of $CHF_3$ gas measured by method 1, of the resin composition (P), is 1 or more and 100 or less, Method 1: After coating the resin composition (P) over a silicon wafer such that a thickness after curing is in a range of 200 nm or more and 350 nm or less, the obtained coating film is cured, next, $O_2$ gas plasma etching is performed on the obtained cured film for 10 seconds, 20 seconds, and 30 seconds, respectively, a reduced film thickness amount of the cured film due to the $O_2$ gas plasma etching is calculated, time (sec) is plotted on a horizontal axis and the reduced film thickness amount (nm) is plotted on a vertical axis, and an etching rate ($O_2$) (nm/sec) of the $O_2$ gas is calculated from a slope of an obtained graph, similarly, $CHF_3$ gas plasma etching is performed on the obtained cured film for 30 seconds, 60 seconds, and 90 seconds, respectively, a reduced film thickness amount of the cured film due to the $CHF_3$ gas plasma etching is calculated, time (sec) is plotted on a horizontal axis and the reduced film thickness amount (nm) is plotted on a vertical axis, and an etching rate ($CHF_3$) (nm/sec) of the $CHF_3$ gas is calculated from a slope of the obtained graph.

* * * * *